United States Patent
Zhang et al.

(10) Patent No.: US 10,446,445 B2
(45) Date of Patent: Oct. 15, 2019

(54) OLED DISPLAY PANEL WITH A PLURALITY OF PIXEL GROUPS ARRANGED IN A MATRIX WITH EACH PIXEL GROUP HAVING TWO SUB-PIXELS AND MANUFACTURING METHOD FOR SAME

(71) Applicant: KUNSHAN NEW FLAT PANEL DISPLAY TECHNOLOGY CENTER CO., LTD., KunShan, Jiangsu (CN)

(72) Inventors: Tingting Zhang, KunShan (CN); Xiuqi Huang, KunShan (CN); Siming Hu, KunShan (CN); Hui Zhu, KunShan (CN); Tao Zhu, KunShan (CN)

(73) Assignee: KUNSHAN NEW FLAT PANEL DISPLAY TECHNOLOGY CENTER CO., LTD., Kunshan, Jiangsu (CN)

( * ) Notice: Subject to any disclaimer, the term of this patent is extended or adjusted under 35 U.S.C. 154(b) by 0 days.

(21) Appl. No.: 15/779,410

(22) PCT Filed: Mar. 9, 2017

(86) PCT No.: PCT/CN2017/076181
§ 371 (c)(1),
(2) Date: May 25, 2018

(87) PCT Pub. No.: WO2017/157244
PCT Pub. Date: Sep. 21, 2017

(65) Prior Publication Data
US 2018/0350680 A1 Dec. 6, 2018

(30) Foreign Application Priority Data
Mar. 16, 2016 (CN) .......................... 2016 1 0149683

(51) Int. Cl.
*H01L 21/77* (2017.01)
*H01L 27/12* (2006.01)
*H01L 27/32* (2006.01)

(52) U.S. Cl.
CPC .............. *H01L 21/77* (2013.01); *H01L 27/12* (2013.01); *H01L 27/1244* (2013.01);
(Continued)

(58) Field of Classification Search
None
See application file for complete search history.

(56) References Cited

U.S. PATENT DOCUMENTS

| 6,226,057 B1 | 5/2001 | Lee | |
| 2001/0015626 A1* | 8/2001 | Ozawa | G09G 3/3225 315/169.1 |

(Continued)

FOREIGN PATENT DOCUMENTS

| CN | 1505445 A | 6/2004 |
| CN | 1728895 A | 2/2006 |

(Continued)

*Primary Examiner* — Bilkis Jahan
(74) *Attorney, Agent, or Firm* — Muncy, Geissler, Olds & Lowe, P.C.

(57) ABSTRACT

Provided are an OLED (Organic Light-Emitting Diode) display panel and a manufacturing method thereof. The OLED display panel comprises a plurality of scan lines (Sn), data lines (D1 and D2), and power lines (VDD), wherein the scan lines (Sn) and the data lines (D1 and D2) define a plurality of pixel groups arranged in a matrix; wherein each pixel group has two sub-pixels, two sub-pixels in a same pixel group connected to a same power line (VDD) and arranged in mirror symmetry with respect to the power line (VDD), and wherein the data lines (D1 and D2) connected to the two sub-pixels in the same pixel group are located on different structural layers. On one hand, the probability of occurrence of a short circuit between the data lines (D1 and (Continued)

D2) is effectively reduced, and crosstalk between the data lines (D1 and D2) is significantly eliminated. On the other hand, the pixel area can be reduced based on existing apparatuses and process conditions, improving the PPI of the OLED display panel, and enhancing the resolution of the OLED display panel.

10 Claims, 18 Drawing Sheets

(52) U.S. Cl.
CPC ...... *H01L 27/1255* (2013.01); *H01L 27/3241* (2013.01); *H01L 27/3265* (2013.01); *H01L 27/3276* (2013.01); *H01L 27/3262* (2013.01); *H01L 2227/32* (2013.01); *H01L 2227/323* (2013.01)

(56) References Cited

U.S. PATENT DOCUMENTS

| | | | |
|---|---|---|---|
| 2003/0189410 A1* | 10/2003 | Yamazaki | G09G 3/3266 315/169.1 |
| 2004/0121523 A1 | 6/2004 | Nakanishi | |
| 2006/0017393 A1 | 1/2006 | Kang et al. | |
| 2014/0097411 A1 | 4/2014 | Choi | |
| 2014/0239270 A1 | 8/2014 | Ko et al. | |
| 2017/0307919 A1* | 10/2017 | Wang | G02F 1/134309 |

FOREIGN PATENT DOCUMENTS

| | | |
|---|---|---|
| CN | 102023401 A | 4/2014 |
| CN | 103792749 A | 5/2014 |
| CN | 103855193 A | 6/2014 |
| CN | 103869564 A | 6/2014 |
| CN | 104022122 A | 9/2014 |
| CN | 204360740 U | 5/2015 |
| CN | 105068349 A | 11/2015 |
| EP | 1612765 A1 | 1/2006 |
| JP | H11-24606 A | 1/1999 |
| JP | 2004-184531 A | 7/2004 |
| JP | 2006-011429 A | 1/2006 |
| JP | 2015-099378 A | 5/2015 |
| TW | I266384 | 11/2006 |
| TW | I266384 B | 11/2006 |
| TW | I469123 B | 1/2015 |
| WO | WO2015/131503 A1 | 9/2015 |

* cited by examiner

OLED DISPLAY PANEL WITH A PLURALITY OF PIXEL GROUPS ARRANGED IN A MATRIX WITH EACH PIXEL GROUP HAVING TWO SUB-PIXELS AND MANUFACTURING METHOD FOR SAME

TECHNICAL FIELD

The present invention relates to the technical field of displays, and in particular, to an organic light-emitting diode (OLED) display panel and a manufacturing method thereof.

BACKGROUND

The development of the information society results in people's increasing demand for display apparatuses. To meet this demand, various flat panel display devices, such as thin film transistor-liquid crystal displays (TFT-LCDs), plasma display panels (PDPs), and OLED displays, all have been developing rapidly. Among these flat panel display devices, the OLED displays are gradually occupying the leading position in flat panel displays due to such advantages as active light emission, high contrast, fast response speed, and light weight. Currently, the OLED displays have been widely applied in various high-performance display fields such as mobile phones, televisions, computers, and intelligent watches.

FIG. 1 is a pixel circuit diagram of a conventional OLED display panel. As shown in FIG. 1, in an existing OLED display panel, a basic pixel circuit comprises a switch transistor T1, a drive transistor T2, and a storage capacitor Cs. A gate of the switch transistor T1 is connected to a scan line Sn; a source of the switch transistor T1 is connected to a data line Dm; a drain of the switch transistor T1, a gate of the drive transistor T2, and a first plate of the storage capacitor Cs are all connected to a node N1; a source of the drive transistor T2 and a second plate of the storage capacitor Cs are both connected to a first power source VDD; and a drain of the drive transistor T2 is connected to an anode of the OLED, and a cathode of the OLED is connected to a second power source VSS. When the switch transistor T1 is turned on via the scan line Sn, a data voltage provided by the data line Dm is stored into the storage capacitor Cs through the switch transistor T1. Thus, the drive transistor T2 is controlled to produce a current, to drive the OLED to emit light.

As the living standard constantly rises and the productivity level increasingly improves, the market is in an urgent need of high-definition and high-resolution products. However, the resolution of the conventional OLED display panel is generally below 250 PPI (PPI indicates the number of pixels per inch. A larger PPI value indicates that the display can use higher pixel density to display an image.), failing to meet people's pursuit of high-resolution displays. An increase in resolution requires a reduced pitch, for example, between adjacent data lines, on the same layer. However, data lines of adjacent pixel units in the conventional OLED are generally disposed on the same structural layer. It is difficult to further reduce the pitch between the adjacent data lines based on existing process conditions (for example, exposure limitation of lithography machines), making it difficult to enhance the resolution of the OLED display panel. In addition to the exposure limitation of lithography machines, crosstalk and a short circuit between the data lines are technical problems to be solved in production of a high-resolution OLED. The crosstalk between data lines refers to coupling between two data lines. Mutual inductance and mutual capacitance between two data lines may cause noise in the data lines. It is shown through studies that when the current intensity is the same on two data lines, a smaller pitch between the two data lines indicates a more obvious crosstalk effect between the two data lines. The short circuit between the data lines refers to that, a pixel electrode cannot receive a normal signal because the two data lines are mutually connected, and thus a failure is caused. Under the same process conditions, a smaller pitch between the two data lines indicates a higher probability of occurrence of a short circuit therebetween.

SUMMARY OF THE INVENTION

An objective of the present invention is to solve the problem of low resolution of a conventional OLED display.

Another objective of the present invention is to eliminate crosstalk and a short circuit between data lines of the OLED display.

To solve the foregoing technical problems, the present invention provides an OLED display panel, which comprises: scan lines, data lines, and power lines that are formed on a substrate, wherein the scan lines and the data lines define a plurality of pixel groups arranged in a matrix, each pixel group having two sub-pixels, the two sub-pixels in a same pixel group connected to a same power line and arranged in mirror symmetry with respect to the power line, and the data lines connected to the two sub-pixels in the same pixel group are located on different structural layers.

Alternatively, in the OLED display panel, the two sub-pixels in each pixel group are a first sub-pixel and a second sub-pixel, the first sub-pixel comprising a first storage capacitor, the second sub-pixel comprising a second storage capacitor.

Alternatively, in the OLED display panel, an upper plate of the first storage capacitor and an upper plate of the second storage capacitor are located on different structural layers.

Alternatively, in the OLED display panel, the first sub-pixel further comprises a first switch transistor and a first drive transistor; the second sub-pixel further comprises a second switch transistor and a second drive transistor; a source of the first switch transistor is connected to a first data line; a source of the second switch transistor is connected to a second data line; the first data line, the second data line and the power line are parallel one another; the scan line is perpendicular to the power line; and each of the first data line and the second data line, the first storage capacitor and the second storage capacitor, the first switch transistor and the second switch transistor as well as the first drive transistor and the second drive transistor are arranged in mirror symmetry with respect to the power line.

Alternatively, the OLED display panel specifically comprises:

a silicon island formed on the substrate and serving as an active layer for the first switch transistor, the first drive transistor, the second switch transistor and the second drive transistor;

a gate insulative layer and first through holes, wherein the gate insulative layer is formed on the substrate and the silicon island, and wherein the first through holes are used to enable electrical connections between a drain of the first switch transistor and a lower plate of the first storage capacitor as well as between a drain of the second switch transistor and a lower plate of the second storage capacitor;

a patterned first metal layer formed on the gate insulative layer and serving as the scan line, the lower plate of the first storage capacitor, the lower plate of the second storage capacitor, a gate of the first switch transistor, a gate of the first drive transistor, a gate of the second switch transistor as well as a gate of the second drive transistor;

a first interlayer insulative layer and a second through hole, wherein the first interlayer insulative layer is formed on the gate insulative layer and the patterned first metal layer, and wherein the second through hole is used to enable an electrical connection between the first data line and the source of the first switch transistor;

a patterned second metal layer formed on the first interlayer insulative layer and serving as the first data line, the source of the first switch transistor as well as the upper plate of the second storage capacitor;

a second interlayer insulative layer and a third through hole, wherein the second interlayer insulative layer is formed on the first interlayer insulative layer and the patterned second metal layer, and wherein the third through hole is used to enable an electrical connection between the second data line and the source of the second switch transistor;

a patterned third metal layer formed on the second interlayer insulative layer and serving as the second data line, the source of the second switch transistor as well as the upper plate of the first storage capacitor;

a third interlayer insulative layer and fourth through holes, wherein the third interlayer insulative layer is formed on the second interlayer insulative layer and the patterned third metal layer, and the fourth through holes are used to enable electrical connections among the source and the drain of the first drive transistor, the source and the drain of the second drive transistor, the power line, the upper plate of the first storage capacitor and the upper plate of the second storage capacitor;

a patterned fourth metal layer formed on the third interlayer insulative layer and serving as the source and the drain of the first drive transistor, the source and the drain of the second drive transistor as well as the power line; and a passivated insulative layer and contact holes, wherein the passivated insulative layer is formed on the third interlayer insulative layer and the patterned fourth metal layer; and wherein the contact holes are used to enable electrical connections between the drain of the first drive transistor and an anode of a first OLED, and a connection of the drain of the second drive transistor and an anode of a second OLED.

Alternatively, the OLED display panel further comprises an opening, and wherein the opening penetrates the second interlayer insulative layer and exactly faces the lower plate of the first storage capacitor.

Alternatively, in the OLED display panel, the upper plate of the first storage capacitor and the upper plate of the second storage capacitor are located on a same structural layer.

Alternatively, the OLED display panel specifically comprises:

a silicon island formed on the substrate and serving as an active layer for the first switch transistor, the first drive transistor, the second switch transistor and the second drive transistor;

a gate insulative layer and first through holes, wherein the gate insulative layer is formed on the substrate and the silicon island, and wherein the first through holes are used to enable electrical connections between a drain of the first switch transistor and a lower plate of the first storage capacitor as well as between a drain of the second switch transistor and a lower plate of the second storage capacitor;

a patterned first metal layer formed on the gate insulative layer and serving as the scan line, the lower plate of the first storage capacitor, the lower plate of the second storage capacitor, a gate of the first switch transistor, a gate of the first drive transistor, a gate of the second switch transistor as well as a gate of the second drive transistor;

a first interlayer insulative layer and a second through hole, wherein the first interlayer insulative layer is formed on the gate insulative layer and the patterned first metal layer, and wherein the second through hole is used to enable an electrical connection between the first data line and the source of the first switch transistor;

a patterned second metal layer formed on the first interlayer insulative layer and serving as the first data line, the source of the first switch transistor, the upper plate of the second storage capacitor as well as the upper plate of the second storage capacitor;

a second interlayer insulative layer and a third through hole, wherein the second interlayer insulative layer is formed on the first interlayer insulative layer and the patterned second metal layer, and wherein the third through hole is used to enable an electrical connection between the second data line and the source of the second switch transistor;

a patterned third metal layer formed on the second interlayer insulative layer and serving as the second data line as well as the source of the second switch transistor;

a third interlayer insulative layer and fourth through holes, wherein the third interlayer insulative layer is formed on the second interlayer insulative layer and the patterned third metal layer, and wherein the fourth through holes are used to enable electrical connections among the source and the drain of the first drive transistor, the source and the drain of the second drive transistor, the power line, the upper plate of the first storage capacitor and the upper plate of the second storage capacitor;

a patterned fourth metal layer formed on the third interlayer insulative layer and serving as the source and the drain of the first drive transistor, the source and the drain of the second drive transistor as well as the power line; and a passivated insulative layer and contact holes, wherein the passivated insulative layer is formed on the third interlayer insulative layer and the patterned fourth metal layer; and wherein the contact holes are used to enable electrical connections between the drain of the first drive transistor and an anode of a first OLED as well as between the drain of the second drive transistor and an anode of a second OLED.

The present invention also provides a method for manufacturing an OLED display panel, comprising:

forming scan lines, data lines, and power lines on a substrate, the scan lines and the data lines defining a plurality of pixel groups arranged in a matrix, wherein each pixel group has two sub-pixels, two sub-pixels in a same pixel group connected to a same power line and arranged in mirror symmetry with respect to the power line, and wherein the data lines connected to the two sub-pixels in the same pixel group are located on different structural layers.

Alternatively, in the method for manufacturing the OLED display panel, the two sub-pixels in each pixel group are a first sub-pixel and a second sub-pixel, the first sub-pixel comprising a first storage capacitor, the second sub-pixel comprising a second storage capacitor; and wherein an upper plate of the first storage capacitor and an upper plate of the second storage capacitor are located on different structural layers, and are formed by performing a process twice.

Alternatively, in the method for manufacturing the OLED display panel, the first sub-pixel further comprises a first switch transistor and a first drive transistor; the second sub-pixel further comprises a second switch transistor and a second drive transistor; a source of the first switch transistor is connected to a first data line; a source of the second switch transistor is connected to a second data line; the first data line, the second data line and the power line are parallel to one another; the scan line is perpendicular to the power line; and each of the first data line and the second data line, the first storage capacitor and the second storage capacitor, the first switch transistor and the second switch transistor as well as the first drive transistor and the second drive transistor are arranged in mirror symmetry with respect to the power line.

Alternatively, in the method for manufacturing the OLED display panel, the OLED display panel is formed through the following steps:

forming a silicon island, wherein the silicon island serves as an active layer for the first switch transistor, the first drive transistor, the second switch transistor and the second drive transistor;

forming a gate insulative layer and first through holes, wherein the gate insulative layer is formed on the substrate and the silicon island, and wherein the first through holes are used to enable electrical connections between a drain of the first switch transistor and a lower plate of the first storage capacitor as well as between a drain of the second switch transistor and a lower plate of the second storage capacitor;

forming a patterned first metal layer, wherein the patterned first metal layer is formed on the gate insulative layer and serves as the scan line, the lower plate of the first storage capacitor, the lower plate of the second storage capacitor, a gate of the first switch transistor, a gate of the first drive transistor, a gate of the second switch transistor as well as a gate of the second drive transistor;

forming a first interlayer insulative layer and a second through hole, wherein the first interlayer insulative layer is formed on the gate insulative layer and the patterned first metal layer, and wherein the second through hole is used to enable an electrical connection between the first data line and the source of the first switch transistor;

forming a patterned second metal layer, wherein the patterned second metal layer is formed on the first interlayer insulative layer and serves as the first data line, the source of the first switch transistor as well as the upper plate of the second storage capacitor;

forming a second interlayer insulative layer and a third through hole, wherein the second interlayer insulative layer is formed on the first interlayer insulative layer and the patterned second metal layer, and wherein the third through hole is used to enable an electrical connection between the second data line and the source of the second switch transistor;

forming a patterned third metal layer, wherein the patterned third metal layer is formed on the second interlayer insulative layer and serves as the second data line, the source of the second switch transistor as well as the upper plate of the first storage capacitor;

forming a third interlayer insulative layer and fourth through holes, wherein the third interlayer insulative layer is formed on the second interlayer insulative layer and the patterned third metal layer, and wherein the fourth through holes are used to enable electrical connections among the source and the drain of the first drive transistor, the source and the drain of the second drive transistor, the power line, the upper plate of the first storage capacitor and the upper plate of the second storage capacitor;

forming a patterned fourth metal layer, wherein the patterned fourth metal layer is formed on the third interlayer insulative layer and serves as the source and the drain of the first drive transistor, the source and the drain of the second drive transistor as well as the power line; and forming a passivated insulative layer and contact holes, wherein the passivated insulative layer is formed on the third interlayer insulative layer and the patterned fourth metal layer; and wherein the contact holes are used to enable electrical connections between the drain of the first drive transistor and an anode of a first OLED as well as between the drain of the second drive transistor and an anode of a second OLED.

Alternatively, in the method for manufacturing the OLED display panel, after the second interlayer insulative layer is formed, an opening penetrating the second interlayer insulative layer is further formed, wherein the opening exactly faces the lower plate of the first storage capacitor.

Alternatively, in the method for manufacturing the OLED display panel, the upper plate of the first storage capacitor and the upper plate of the second storage capacitor are located on the same structural layer, and are formed through a process in one attempt.

Alternatively, in the method for manufacturing the OLED display panel, the OLED display panel is formed specifically through the following steps:

forming a silicon island, wherein the silicon island is formed on the substrate and serves as an active layer for the first switch transistor, the first drive transistor, the second switch transistor and the second drive transistor;

forming a gate insulative layer and first through holes, wherein the gate insulative layer is formed on the substrate and the silicon island, and wherein the first through holes are used to enable electrical connections between a drain of the first switch transistor and a lower plate of the first storage capacitor as well as between a drain of the second switch transistor and a lower plate of the second storage capacitor;

forming a patterned first metal layer, wherein the patterned first metal layer is formed on the gate insulative layer and serves as the scan line, the lower plate of the first storage capacitor, the lower plate of the second storage capacitor, a gate of the first switch transistor, a gate of the first drive transistor, a gate of the second switch transistor as well as a gate of the second drive transistor;

forming a first interlayer insulative layer and a second through hole, wherein the first interlayer insulative layer is formed on the gate insulative layer and the patterned first metal layer; and wherein the second through hole is used to enable an electrical connection between the first data line and the source of the first switch transistor;

forming a patterned second metal layer, wherein the patterned second metal layer is formed on the first interlayer insulative layer and serves as the first data line, the source of the first switch transistor, the upper plate of the second storage capacitor as well as the upper plate of the second storage capacitor;

forming a second interlayer insulative layer and a third through hole, wherein the second interlayer insulative layer is formed on the first interlayer insulative layer and the patterned second metal layer, and wherein the third through hole is used to enable an electrical connection of the second data line and the source of the second switch transistor;

forming a patterned third metal layer, wherein the patterned third metal layer is formed on the second interlayer insulative layer and serves as the second data line as well as the source of the second switch transistor;

forming a third interlayer insulative layer and fourth through holes, wherein the third interlayer insulative layer is formed on the second interlayer insulative layer and the patterned third metal layer, and wherein the fourth through holes are used to enable electrical connections among the source and the drain of the first drive transistor, the source and the drain of the second drive transistor, the power line, the upper plate of the first storage capacitor and the upper plate of the second storage capacitor;

forming a patterned fourth metal layer, wherein the patterned fourth metal layer is formed on the third interlayer insulative layer and serves as the source and the drain of the first drive transistor, the source and the drain of the second drive transistor as well as the power line; and forming a passivated insulative layer and contact holes, wherein the passivated insulative layer is formed on the third interlayer insulative layer and the patterned fourth metal layer; and wherein the contact holes are used to enable electrical connections between the drain of the first drive transistor and an anode of a first OLED as well as between the drain of the second drive transistor and an anode of a second OLED.

The OLED display panel provided by the present invention comprises scan lines, data lines and power lines VDD. The scan lines and the data lines define a plurality of pixel groups arranged in a matrix, each pixel group having two sub-pixels, two sub-pixels in the same pixel group connected to a same power line VDD and arranged in mirror symmetry with respect to the power line VDD, and wherein the data lines connected to the two sub-pixels in the same pixel group are located on different structural layers (that is, the data lines connected to the two sub-pixels are not on the same layer). On one hand, because the data lines correspondingly connected to the two sub-pixels in the same pixel group are disposed on different structural layers, a distance between adjacent data lines on the same layer is doubled without reducing the pixel area, and adjacent data lines on different layers are isolated by an interlayer insulative layer, thus effectively reducing the probability of occurrence of a short circuit between data lines. Moreover, crosstalk between the data lines is significantly eliminated during use, which not only enhances the product yield, but also improves the image quality of the product. On the other hand, because the data lines correspondingly connected to the two sub-pixels in the same pixel group are disposed on different structural layers, the pixel area can be reduced based on existing apparatuses and process conditions, improving the PPI of the OLED display panel, and enhancing the resolution of the OLED display panel.

Further, an upper plate of the first storage capacitor and an upper plate of the second storage capacitor are located on different structural layers, and are formed by performing a process twice. For example, the first data line and the upper plate of the second storage capacitor are formed together, while the second data line and the upper plate of the first storage capacitor are formed together. That is, the first data line and the upper plate of the first storage capacitor are not on the same layer, and the second data line and the upper plate of the second storage capacitor are not on the same layer. Therefore, a distance between a data line and an upper plate of a storage capacitor that are on the same layer can be reduced, thus further reducing the pixel area and improving the PPI of the OLED display panel.

DESCRIPTION OF REFERENCE NUMERALS

Figure 1:
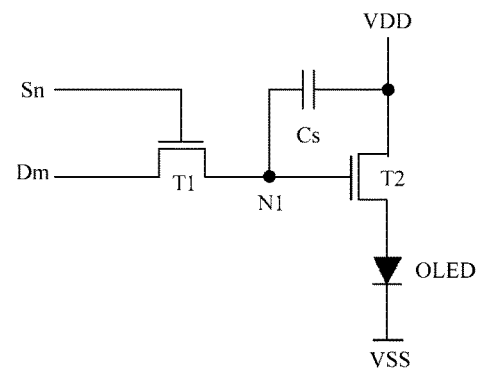
FIG. 1 is a pixel circuit diagram of a conventional OLED display panel.

T11: first switch transistor; G11: gate of the first switch transistor; S11: source of the first switch transistor; D11: drain of the first switch transistor;
T12: first drive transistor; G12: gate of the first drive transistor; S12: source of the first drive transistor; D12: drain of the first drive transistor;
T21: second switch transistor; G21: gate of the second switch transistor; S21: source of the second switch transistor; D21: drain of the second switch transistor;
T22: second drive transistor; G22: gate of the second drive transistor; S22: source of the second drive transistor; D22: drain of the second drive transistor;
C1: first storage capacitor; C1-1: lower plate of the first storage capacitor; and C1-2: upper plate of the first storage capacitor;
C2: second storage capacitor; C2-1: lower plate of the second storage capacitor; C2-2: upper plate of the second storage capacitor;
D1: first data line; D2: second data line; Sn: scan line; VDD: power line;
100: substrate; 101: buffer layer;
111-1: first segment of a silicon island; 111-2: second segment of a silicon island; 112-1: third segment of a silicon island; 112-2: fourth segment of a silicon island; 113: fifth segment of a silicon island; 114: sixth segment of a silicon island;
120: gate insulative layer; 120a-1 and 120a-2: first through hole;
140: first interlayer insulative layer; 140a-1: second through hole;
160: second interlayer insulative layer; 160a-2: third through hole; 160b: opening;
180: third interlayer insulative layer; 180a, 180a-1, 180a-2, 180a-3, and 180a-4: fourth through hole;
200: passivated insulative layer; 200a-1 and 200a-2: contact hole;
221: anode of a first OLED; 222: anode of a second OLED.

DETAILED DESCRIPTION

The main concept of the present invention lies in the provision of an OLED display panel and a manufacturing method thereof, in which, the OLED display panel comprises a scan line, a data line, and a power line VDD, wherein the scan line and the data line define a plurality of pixel groups arranged in the form of a matrix, each pixel group having two sub-pixels, two sub-pixels in the same pixel group being connected to the same power line VDD and being arranged in mirror symmetry with respect to the power line VDD, and wherein the data lines separately connected to the two sub-pixels in the same pixel group are located on different structural layers. As such, a distance between adjacent data lines on the same layer is doubled without reducing a pixel area, and adjacent data lines on different layers are isolated by an interlayer insulative layer, thus effectively reducing the probability of occurrence of a short circuit between data lines, and significantly eliminating crosstalk between the data lines. In addition, because the data lines correspondingly connected to the two sub-pixels in the same pixel group are disposed on different structural layers, the pixel area can be reduced based on existing apparatuses and process conditions, improving the PPI of the OLED display panel, and enhancing the resolution of the OLED display panel.

The OLED display panel and a method for manufacturing the OLED display panel according to the present invention are further described in detail below with reference to the accompanying drawings and the specific embodiments. The advantages and features of the present invention will be more apparent according to the following descriptions and claims. It should be noted that, the film thickness, and the size and shapes of regions in each layer in the drawings do not reflect the true scale of the OLED display panel, and the purpose is only to schematically illustrate the content of the present invention.

Embodiment 1

Figure 12A:
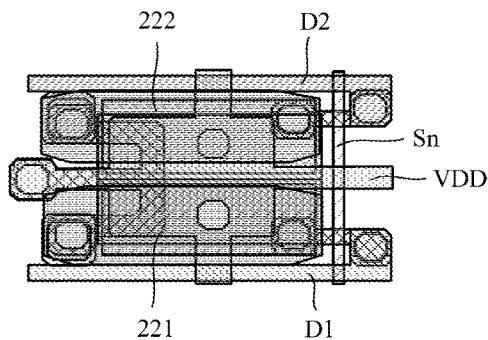
FIG. 12a is a planar schematic diagram of a pixel group of an OLED display panel after an anode is formed in Embodiment 1 of the present invention.
Figure 12B:
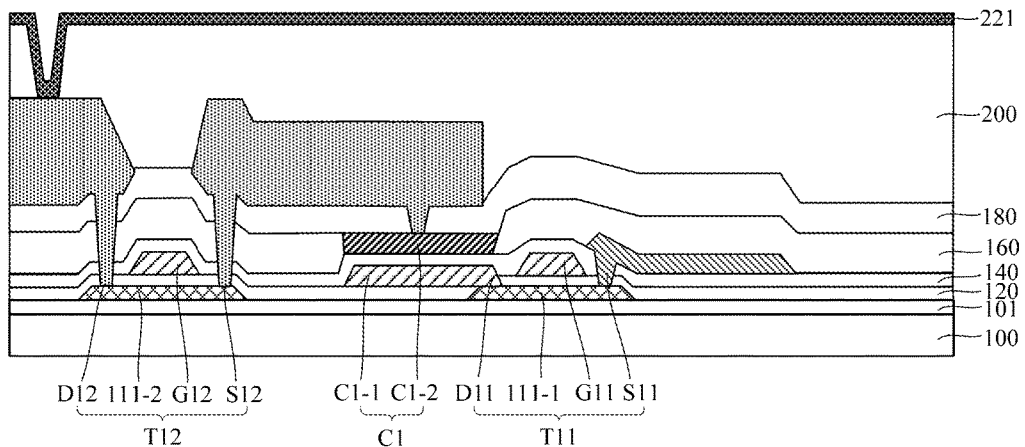
FIG. 12b is a cross-sectional schematic diagram of a first sub-pixel of an OLED display panel after the anode is formed in Embodiment 1 of the present invention.
Figure 12C:
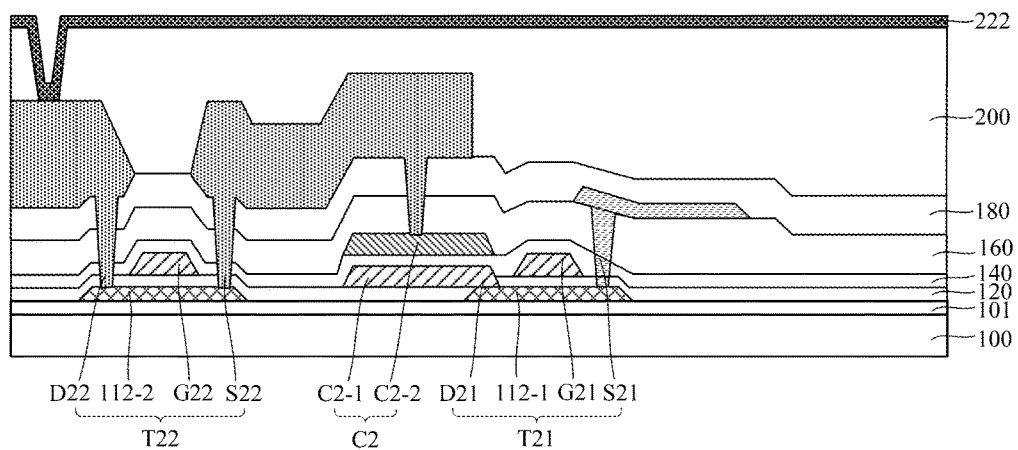
FIG. 12c is a cross-sectional schematic diagram of a second sub-pixel of an OLED display panel after the anode is formed in Embodiment 1 of the present invention.

FIG. 12a is a planar schematic diagram of a pixel group of an OLED display panel in Embodiment 1 of the present invention, which shows a structure comprising two sub-pixels. FIG. 12b is a cross-sectional schematic diagram of a first sub-pixel in FIG. 12a. FIG. 12c is a cross-sectional schematic diagram of a second sub-pixel in FIG. 12a.

As shown in FIG. 12a, FIG. 12b and FIG. 12c, a main structure of the OLED display panel in this embodiment comprises a scan line, a data line, and a power line that are formed on a substrate 100, wherein the scan line and the data line define a plurality of pixel groups arranged in the form of a matrix. Each pixel group has two sub-pixels. Two sub-pixels in the same pixel group are connected to the same power line VDD and are arranged in mirror symmetry with respect to the power line VDD. The data lines separately connected to the two sub-pixels in the same pixel group are located on different structural layers. For ease of description of the technical solution in this embodiment, as shown in FIG. 12a, the two sub-pixels arranged up and down in a planar direction of the figure are referred to as a first sub-pixel and a second sub-pixel, wherein the sub-pixel on the lower side is called the first sub-pixel and the one on the upper side is called the second sub-pixel. A data line connected to a source of a switch transistor of the first sub-pixel is called a first data line D1, and a data line connected to a source of a switch transistor of the second sub-pixel is called a second data line D2.

Continuously referring to FIGS. 12a, 12b and 12c, and with combined reference to FIG. 2a to FIG. 11c, the first data line D1 is located below the second interlayer insulative layer 160 (specifically, between a first interlayer insulative layer 140 and a second interlayer insulative layer 160). The first data line D1 is connected to a source S11 of a first switch transistor by a through hole (which refers to a second through hole 140a-1 herein) penetrating the first interlayer insulative layer 140. The second data line D2 is located above the second interlayer insulative layer 160 (specifically, between the second interlayer insulative layer 160 and a third interlayer insulative layer 180). The second data line D2 is connected to a source S21 of a second switch transistor by a through hole (which refers to a third through hole 160a-2 herein) penetrating the first interlayer insulative layer 140 and the second interlayer insulative layer 160. That is, the first data line D1 and the second data line D2 are respectively located at two sides of the second interlayer insulative layer 160. The second interlayer insulative layer 160 is disposed to separate the first data line D1 and the second data line D2. The first data line D1 and the second data line D2 are connected to the sources of the switch transistors via through holes of different depths. As such, a pitch between adjacent data lines on the same layer is doubled without reducing the pixel area, and adjacent data lines on different layers are isolated by an interlayer insulative layer (which specifically refers to the second interlayer insulative layer 160 herein), thus effectively reducing the probability of occurrence of a short circuit between data lines during production. Moreover, crosstalk between the data lines is significantly eliminated during use, which not only enhances the product yield, but also improves the image quality of the product. Apparently, because the data lines correspondingly connected to the two sub-pixels in the same pixel group are disposed on different structural layers (the pitch between adjacent data lines on the same layer is increased), the pixel area can be reduced without being necessarily limited by the existing apparatuses and process conditions, improving the PPI of the OLED display panel.

Specifically, as shown in FIG. 12a and FIG. 12b, the first sub-pixel comprises a first switch transistor T11, a first drive transistor T12, and a first storage capacitor C1. The first switch transistor T11 comprises a gate G11, a source S11, a drain D11, and an active layer 111-1 (that is, a first segment of a silicon island). The first drive transistor T12 comprises a gate G12, a source S12, a drain D12, and an active layer 111-2 (that is, a second segment of the silicon island). The first storage capacitor C1 comprises a first plate (that is, a lower plate C1-1), a second plate (that is, an upper plate C1-2), and the first interlayer insulative layer 140 formed between the lower plate C1-1 and the upper plate C1-2. The gate G11 of the first switch transistor T11 is connected to the scan line Sn (they actually form an integral structure). The source S11 of the first switch transistor T11 is connected to the first data line D1 (they actually form an integral structure). The drain D11 of the first switch transistor T11, the first plate (that is, the lower plate C1-1) of the first storage capacitor C1, and the gate G12 of the first drive transistor T12 are connected. The source S12 of the first drive transistor T12 and the second plate (that is, the upper plate C1-2) of the first storage capacitor C1 are both connected to the power line VDD. The drain D12 of the first drive transistor T12 is connected to an anode 221 of a first OLED. The scan line Sn is used to provide an on/off voltage for the first switch transistor T11. The first drive transistor T12 is used to control the first data line D1 to provide a data voltage for the first OLED.

Specifically, as shown in FIG. 12a and FIG. 12c, the second sub-pixel comprises a second switch transistor T21, a second drive transistor T22, and a second storage capacitor C2. The second switch transistor T21 comprises a gate G21, a source S21, a drain D21, and an active layer 112-1 (that is, a third segment of the silicon island). The second drive transistor T22 comprises a gate G22, a source S22, a drain D22, and an active layer 112-2 (that is, a fourth segment of the silicon island). The second storage capacitor C2 comprises a first plate (that is, a lower plate C2-1), a second plate (that is, an upper plate C2-2), and the first interlayer insulative layer 140 formed between the lower plate C2-1 and the upper plate C2-2. The gate G21 of the second switch transistor T21 is connected to the scan line Sn (they actually form an integral structure). The source S21 of the second switch transistor T21 is connected to the second data line D2 (they actually form an integral structure). The drain D21 of the second switch transistor T21, the first plate (that is, the lower plate C2-1) of the second storage capacitor C2, and the gate G22 of the second drive transistor T22 are connected. The source S22 of the second drive transistor T22 and the second plate (that is, the upper plate C2-2) of the second storage capacitor C2 are both connected to the power line VDD. The drain D22 of the second drive transistor T22 is connected to an anode 222 of a second OLED. The scan line Sn is used to provide an on/off voltage for the second switch transistor T21. The second drive transistor T22 is used to control the second data line D2 to provide a data voltage for the second OLED.

Figure 10A:
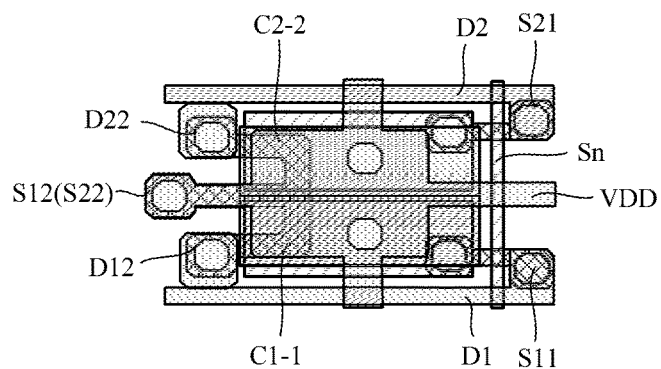
FIG. 10a is a planar schematic diagram of a pixel group of an OLED display panel after a fourth metal layer is formed in Embodiment 1 of the present invention.
Figure 11A:
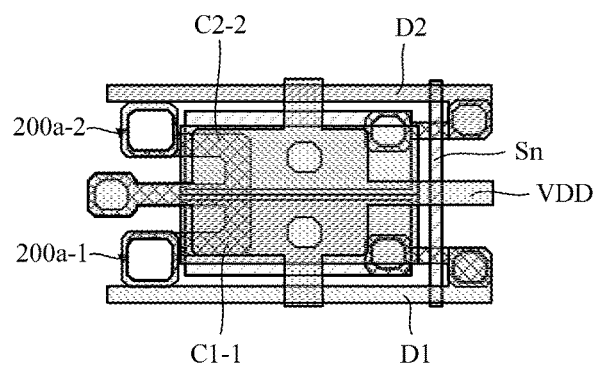
FIG. 11a is a planar schematic diagram of a pixel group of an OLED display panel after a contact hole is formed in Embodiment 1 of the present invention.

Continuously referring to FIGS. 10a, 11a, and 12a, the first data line D1, the second data line D2, and the power line VDD are parallel to each other. The scan line Sn is perpendicular to the power line VDD. The first data line D1 and the second data line D2 are arranged in mirror symmetry with respect to the power line VDD. In addition, the first storage capacitor C1 and the second storage capacitor C2 are arranged in mirror symmetry with respect to the power line VDD. The first switch transistor T11 and the second switch transistor T21 are arranged in mirror symmetry with respect to the power line VDD. The first drive transistor T12 and the second drive transistor T22 are arranged in mirror symmetry with respect to the power line VDD. Specifically, in this embodiment, the lower plate C1-1 of the first storage capacitor C1 and the lower plate C2-1 of the second storage capacitor C2 are both in a shape of rectangle, identical in area, and are arranged in mirror symmetry with respect to the power line VDD. The upper plate C1-2 of the first storage capacitor C1 and the upper plate C2-2 of the second storage capacitor C2 are both in a shape of rectangle, identical in area, and are arranged in mirror symmetry with respect to the power line VDD.

Figure 2A:
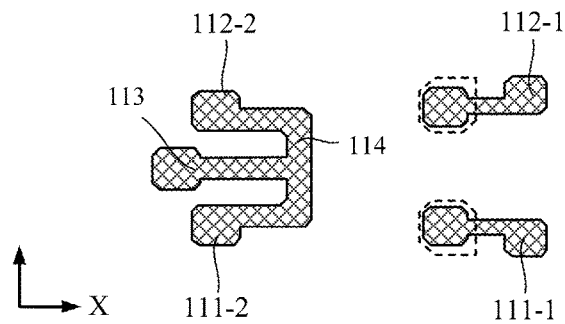
FIG. 2a is a planar schematic diagram of a pixel group of an OLED display panel after a silicon island is formed in Embodiment 1 of the present invention.
Figure 2B:
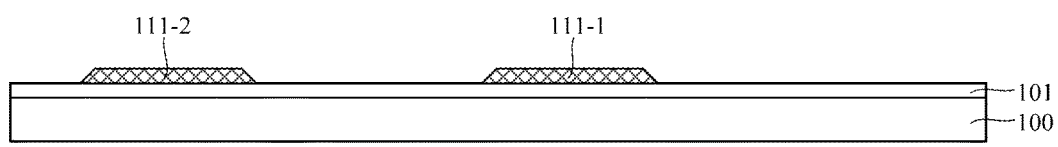
FIG. 2b is a cross-sectional schematic diagram of a first sub-pixel of an OLED display panel after the silicon island is formed in Embodiment 1 of the present invention.
Figure 2C:
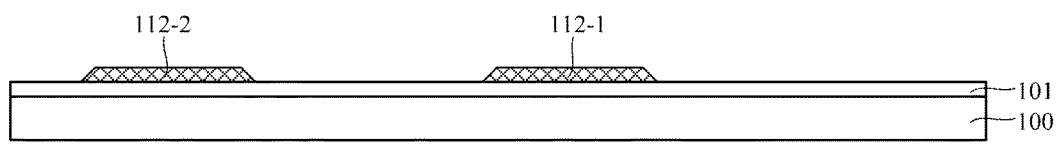
FIG. 2c is a cross-sectional schematic diagram of a second sub-pixel of an OLED display panel after the silicon island is formed in Embodiment 1 of the present invention.

Mainly referring to FIGS. 2a, 2b and 2c, the OLED display panel further comprises a silicon island. The silicon island is formed on the substrate 100, and serves as an active layer for the first switch transistor T11, the first drive transistor T12, the second switch transistor T21, and the second drive transistor T22.

Figure 3A:
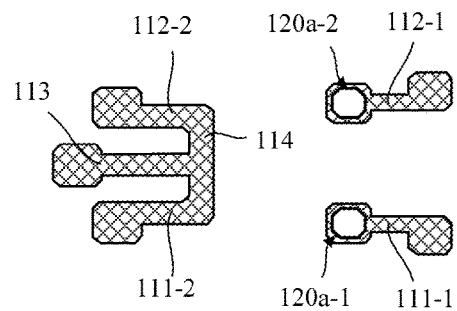
FIG. 3a is a planar schematic diagram of a pixel group of an OLED display panel after a first through hole is formed in Embodiment 1 of the present invention.
Figure 3B:
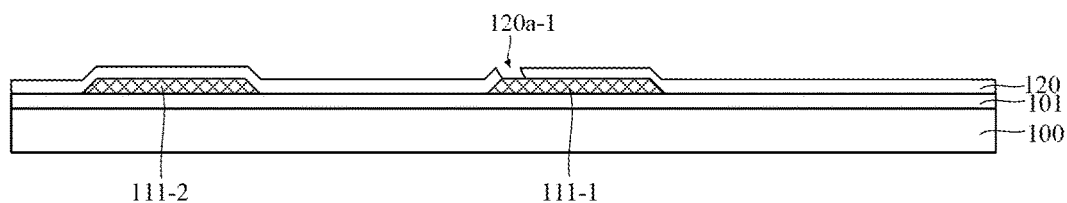
FIG. 3b is a cross-sectional schematic diagram of a first sub-pixel of an OLED display panel after the first through hole is formed in Embodiment 1 of the present invention.
Figure 3C:
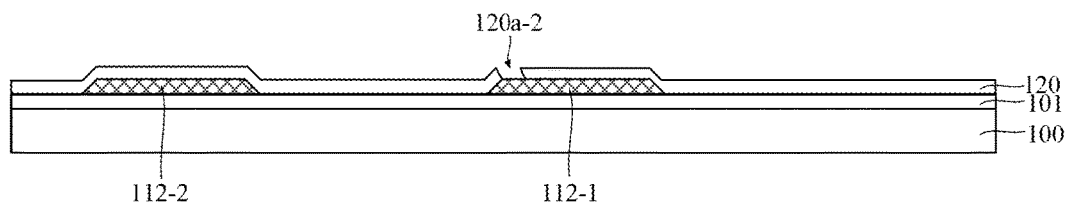
FIG. 3c is a cross-sectional schematic diagram of a second sub-pixel of an OLED display panel after the first through hole is formed in Embodiment 1 of the present invention.

Mainly referring to FIGS. 3a, 3b and 3c, the OLED display panel further comprises a gate insulative layer 120 and first through holes 120a-1 and 120a-2. The gate insulative layer 120 is formed on the substrate 100 and the silicon island. The first through holes 120a-1 and 120a-2 penetrate the gate insulative layer 120. The first through hole 120a-1 is used to enable an electrical connection of the drain D11 of the first switch transistor T11 to the lower plate C1-1 of the first storage capacitor C1. The first through hole 120a-2 is used to enable an electrical connection of the drain D21 of the second switch transistor T21 to the lower plate C2-1 of the second storage capacitor C2.

Figure 4A:
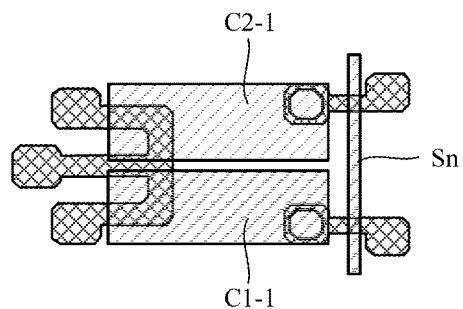
FIG. 4a is a planar schematic diagram of a pixel group of an OLED display panel after a first metal layer is formed in Embodiment 1 of the present invention.
Figure 4B:
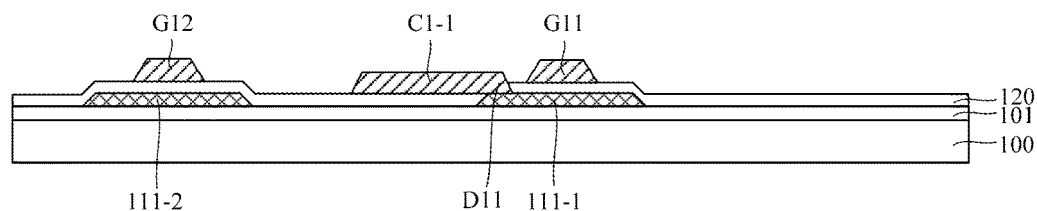
FIG. 4b is a cross-sectional schematic diagram of a first sub-pixel of an OLED display panel after the first metal layer is formed in Embodiment 1 of the present invention.
Figure 4C:
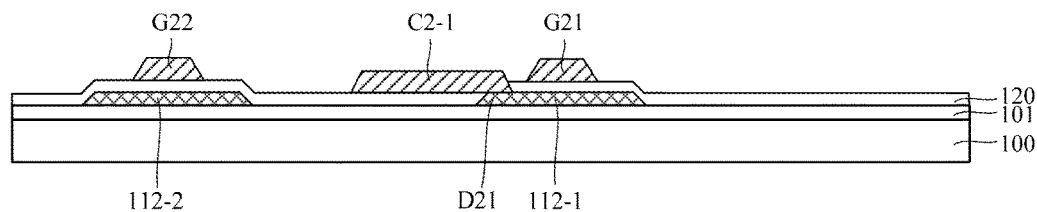
FIG. 4c is a cross-sectional schematic diagram of a second sub-pixel of an OLED display panel after the first metal layer is formed in Embodiment 1 of the present invention.

Mainly referring to FIGS. 4a, 4b and 4c, the OLED display panel further comprises a patterned first metal layer. The patterned first metal layer is formed on the gate insulative layer 120 and serves as the gate G11 of the first switch transistor T11, the gate G12 of the first drive transistor T12, the gate G21 of the second switch transistor T21, the gate G22 of the second drive transistor T22, the scan line Sn, a first electrode (that is, the lower plate C1-1) of the first storage capacitor C1, and a first electrode (that is, the lower plate C2-1) of the second storage capacitor C2.

Figure 5A:
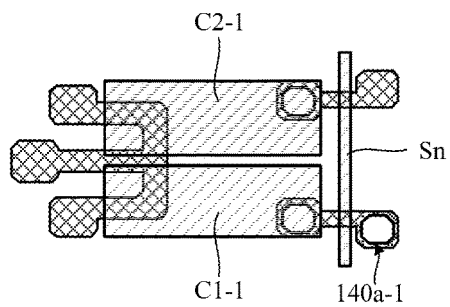
FIG. 5a is a planar schematic diagram of a pixel group of an OLED display panel after a second through hole is formed in Embodiment 1 of the present invention.
Figure 5B:
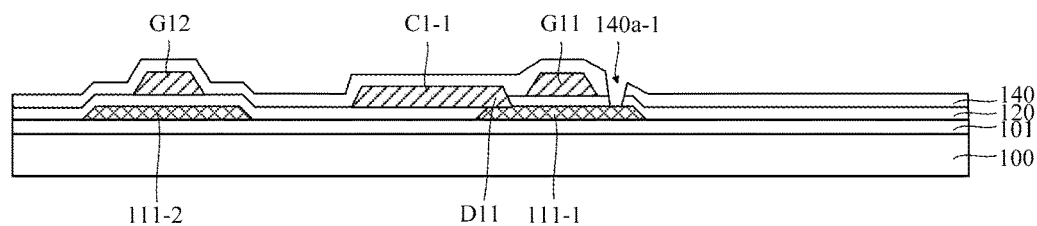
FIG. 5b is a cross-sectional schematic diagram of a first sub-pixel of an OLED display panel after the second through hole is formed in Embodiment 1 of the present invention.
Figure 5C:
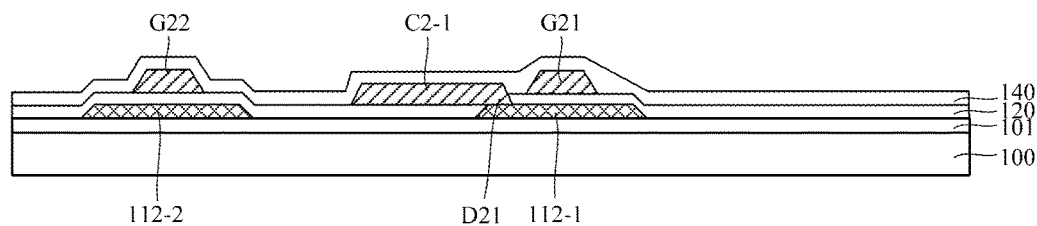
FIG. 5c is a cross-sectional schematic diagram of a second sub-pixel of an OLED display panel after the second through hole is formed in Embodiment 1 of the present invention.

Mainly referring to FIGS. 5a, 5b and 5c, the OLED display panel further comprises a first interlayer insulative layer 140 and a second through hole 140a-1. The first interlayer insulative layer 140 is formed on the gate insulative layer 120 and the patterned first metal layer. The second through hole 140a-1 is used to enable an electrical connection of the first data line D1 to the source S11 of the first switch transistor T11.

Figure 6A:
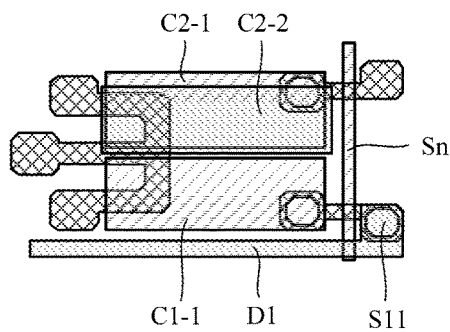
FIG. 6a is a planar schematic diagram of a pixel group of an OLED display panel after a second metal layer is formed in Embodiment 1 of the present invention.
Figure 6B:
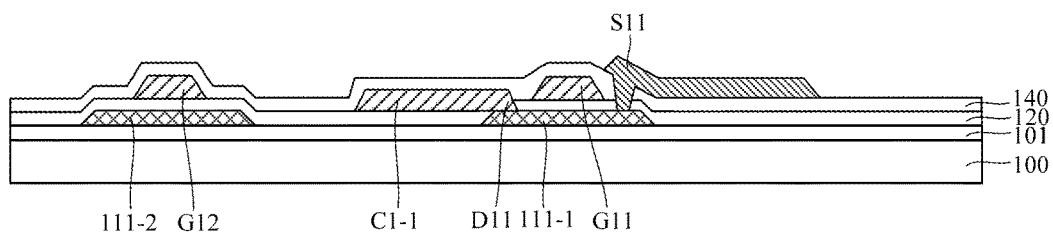
FIG. 6b is a cross-sectional schematic diagram of a first sub-pixel of an OLED display panel after the second metal layer is formed in Embodiment 1 of the present invention.
Figure 6C:
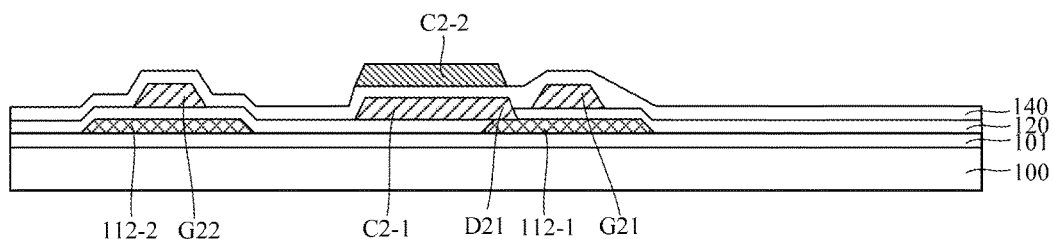
FIG. 6c is a cross-sectional schematic diagram of a second sub-pixel of an OLED display panel after the second metal layer is formed in Embodiment 1 of the present invention.

Mainly referring to FIGS. 6a, 6b and 6c, the OLED display panel further comprises a patterned second metal layer. The patterned second metal layer is formed on the first interlayer insulative layer 140 and serves as the first data line D1, the source S11 of the first switch transistor T11, and a second electrode (that is, the upper plate C2-2) of the second storage capacitor C2.

Figure 7A:
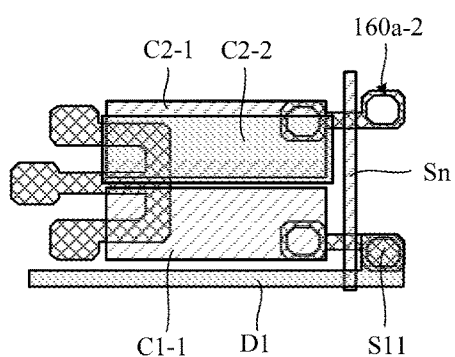
FIG. 7a is a planar schematic diagram of a pixel group of an OLED display panel after a third through hole is formed in Embodiment 1 of the present invention.
Figure 7B:
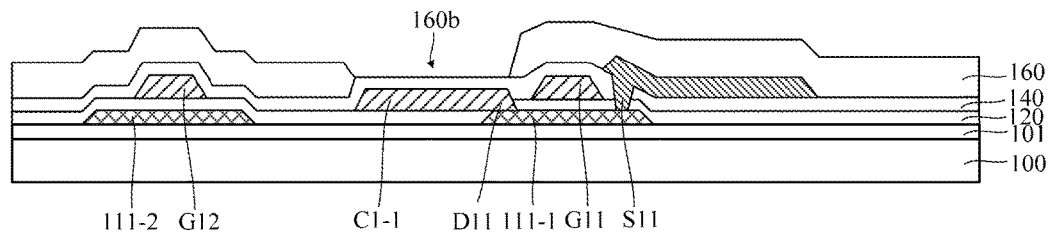
FIG. 7b is a cross-sectional schematic diagram of a first sub-pixel of an OLED display panel after the third through hole is formed in Embodiment 1 of the present invention.
Figure 7C:
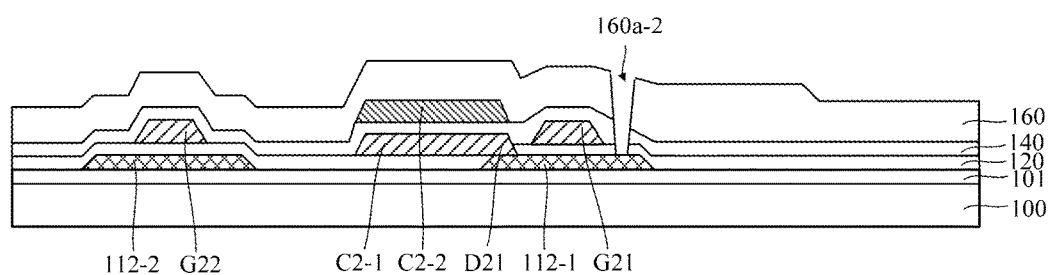
FIG. 7c is a cross-sectional schematic diagram of a second sub-pixel of an OLED display panel after the third through hole is formed in Embodiment 1 of the present invention.

Mainly referring to FIGS. 7a, 7b and 7c, the OLED display panel further comprises a second interlayer insulative layer 160 and a third through hole 160a-2. The second interlayer insulative layer 160 is formed on the first interlayer insulative layer 140 and the patterned second metal layer. The third through hole 160a-2 is used to enable an electrical connection of the second data line D2 to the source S21 of the second switch transistor T21. Further, the OLED display panel also comprises an opening 160b. The opening 160b penetrates the second interlayer insulative layer 160, and exactly faces the lower plate C1-1 of the first storage capacitor C1.

Figure 8A:
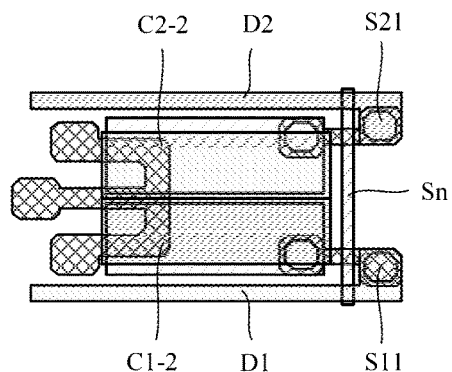
FIG. 8a is a planar schematic diagram of a pixel group of an OLED display panel after a third metal layer is formed in Embodiment 1 of the present invention.
Figure 8B:
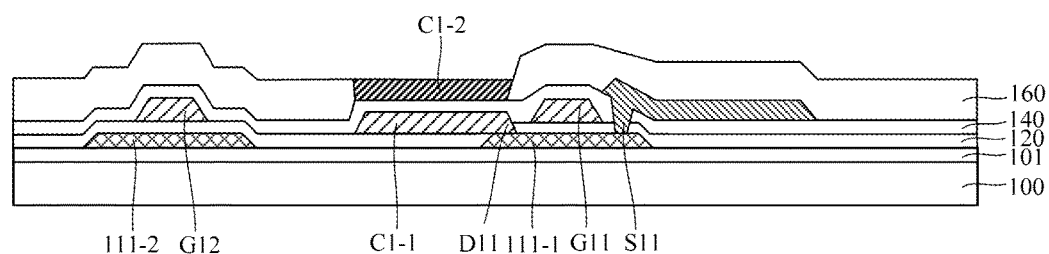
FIG. 8b is a cross-sectional schematic diagram of a first sub-pixel of an OLED display panel after the third metal layer is formed in Embodiment 1 of the present invention.
Figure 8C:
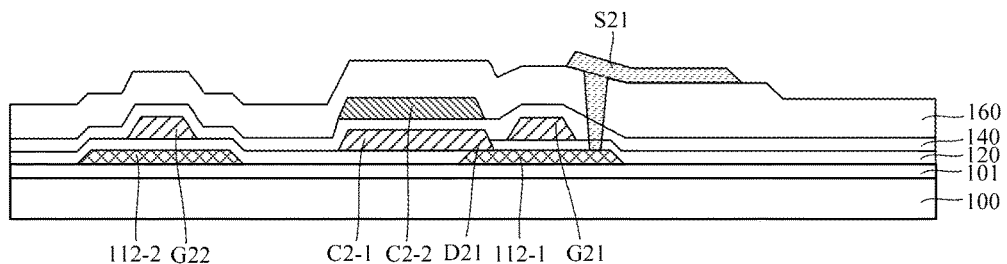
FIG. 8c is a cross-sectional schematic diagram of a second sub-pixel of an OLED display panel after the third metal layer is formed in Embodiment 1 of the present invention.

Mainly referring to FIGS. 8a, 8b and 8c, the OLED display panel further comprises a patterned third metal layer. The patterned third metal layer is formed on the second interlayer insulative layer 160 and the opening 160b, and serves as the second data line D2, the source S21 of the second switch transistor T21, and a second electrode (that is, the upper plate C1-2) of the first storage capacitor C1.

Figure 9A:
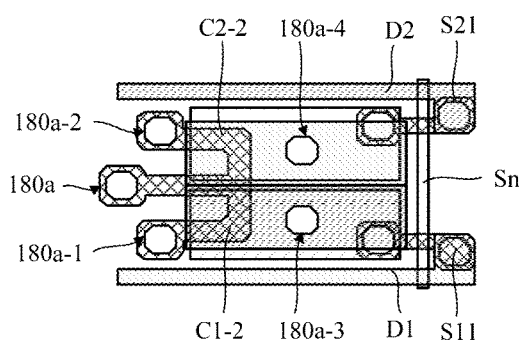
FIG. 9a is a planar schematic diagram of a pixel group of an OLED display panel after a fourth through hole is formed in Embodiment 1 of the present invention.
Figure 9B:
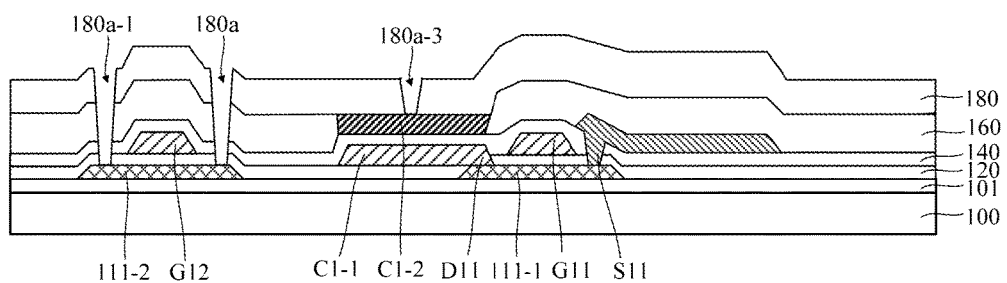
FIG. 9b is a cross-sectional schematic diagram of a first sub-pixel of an OLED display panel after the fourth through hole is formed in Embodiment 1 of the present invention.
Figure 9C:
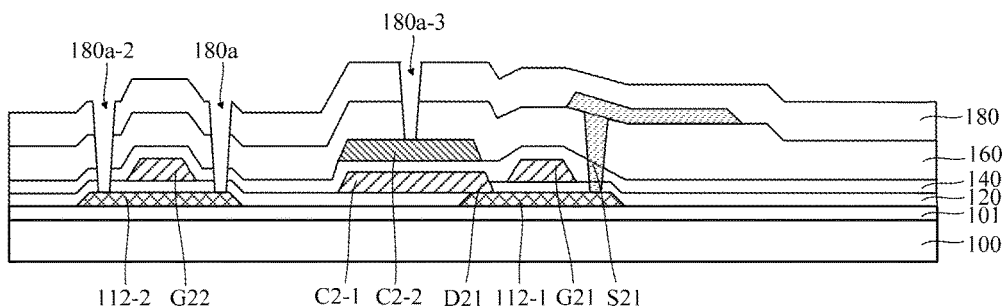
FIG. 9c is a cross-sectional schematic diagram of a second sub-pixel of an OLED display panel after the fourth through hole is formed in Embodiment 1 of the present invention.

Mainly referring to FIGS. 9a, 9b and 9c, the OLED display panel further comprises a third interlayer insulative layer 180 and fourth through holes 180a, 180a-1, 180a-2, 180a-3, and 180a-4. The third interlayer insulative layer 180 is formed on the second interlayer insulative layer 160 and the patterned third metal layer, and the fourth through holes 180a, 180a-1, 180a-2, 180a-3, and 180a-4 are used to enable electrical connections of a source and a drain of the first drive transistor T12, a source and a drain of the second drive transistor T22, the power line VDD, the upper plate C1-2 of the first storage capacitor C1 and the upper plate C2-2 of the second storage capacitor C2.

Figure 10B:
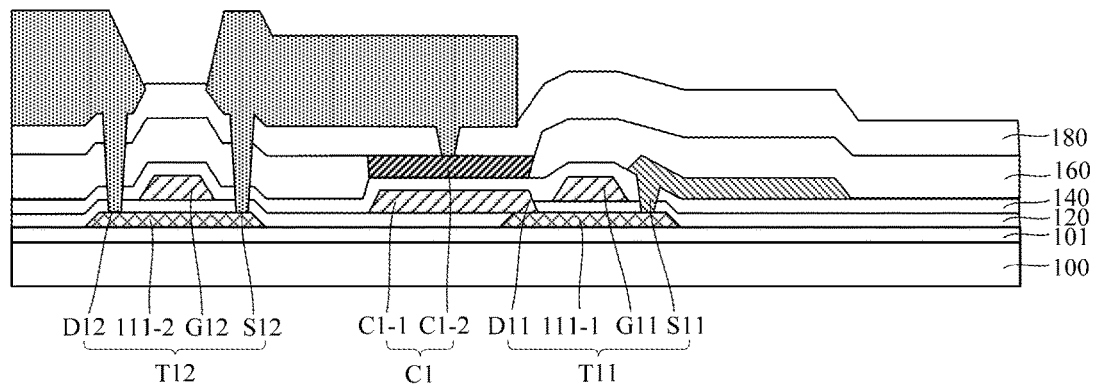
FIG. 10b is a cross-sectional schematic diagram of a first sub-pixel of an OLED display panel after the fourth metal layer is formed in Embodiment 1 of the present invention.
Figure 10C:
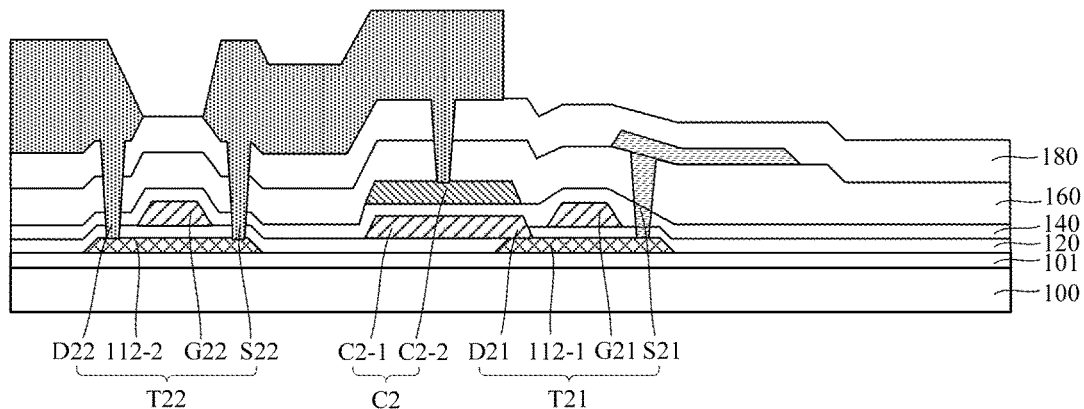
FIG. 10c is a cross-sectional schematic diagram of a second sub-pixel of an OLED display panel after the fourth metal layer is formed in Embodiment 1 of the present invention.

Mainly referring to FIGS. 10a, 10b and 10c, the OLED display panel further comprises a patterned fourth metal layer. The patterned fourth metal layer is formed on the third interlayer insulative layer 180 and serves as the source S12 and the drain D12 of the first drive transistor T12, the source S22 and the drain D22 of the second drive transistor T22, and the power line VDD.

Figure 11B:
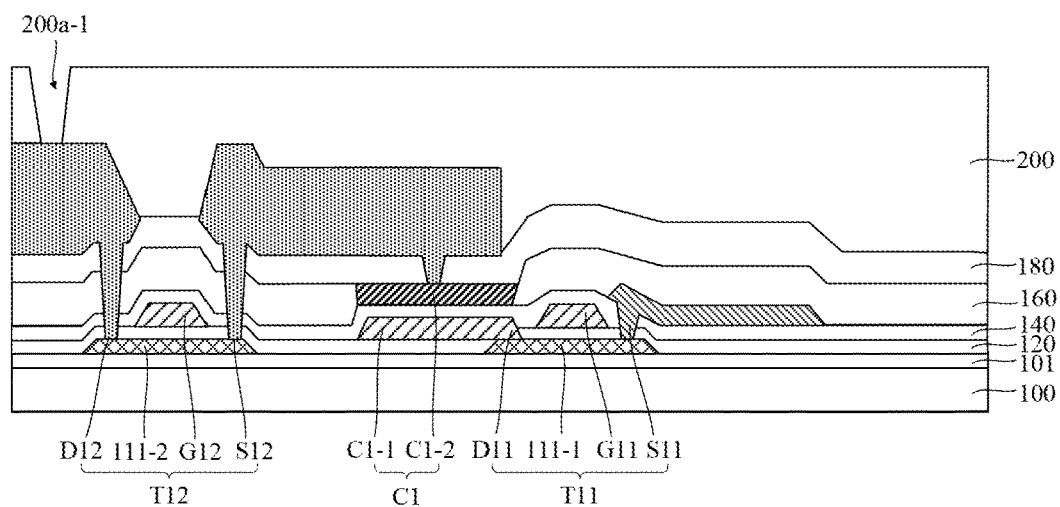
FIG. 11b is a cross-sectional schematic diagram of a first sub-pixel of an OLED display panel after the contact hole is formed in Embodiment 1 of the present invention.
Figure 11C:
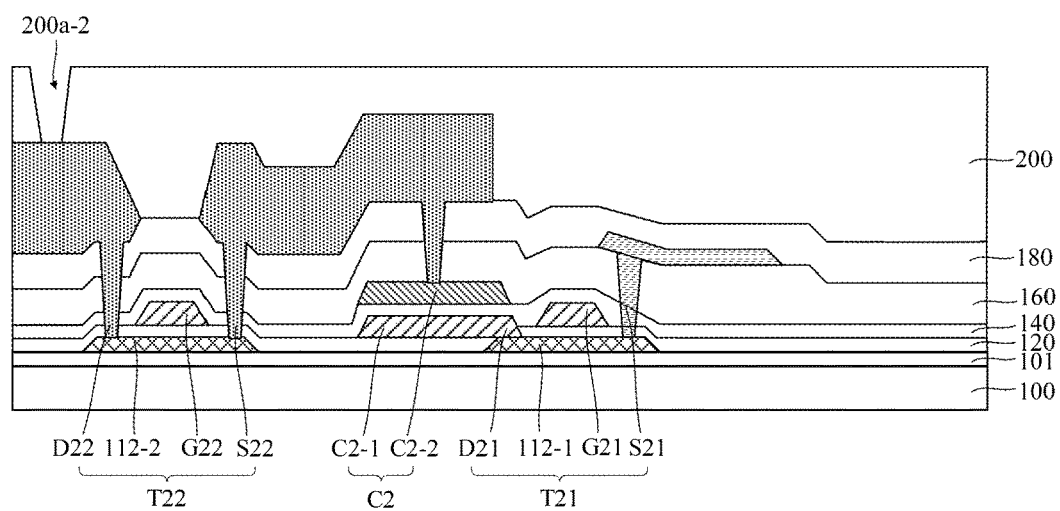
FIG. 11c is a cross-sectional schematic diagram of a second sub-pixel of an OLED display panel after the contact hole is formed in Embodiment 1 of the present invention.

Mainly referring to FIGS. 11a, 11b and 11c, the OLED display panel further comprises a passivated insulative layer 200 and contact holes 200a-1 and 200a-2. The passivated insulative layer 200 is formed on the third interlayer insulative layer 180 and the patterned fourth metal layer. The contact hole 200a-1 is used to enable an electrical connection of the drain of the first drive transistor T12 to an anode 221 of a first OLED, and the contact hole 200a-2 is used to enable an electrical connection of the drain of the second drive transistor T22 to an anode 222 of a second OLED.

The technical solution of this embodiment is further described below with reference to the planar top views and cross-sectional schematic diagrams of a manufacturing process of an OLED display panel in Embodiment 1 of the present invention. In the following description, the lithography processes referred to in the present invention comprise photoresist coating, masking, exposure, etching, photoresist stripping, and the like. A positive photoresist is used as an example of the photoresist.

FIG. 2a is a planar schematic diagram of a pixel group of an OLED display panel after a silicon island is formed in Embodiment 1 of the present invention. FIG. 2b is a cross-sectional schematic diagram of a first sub-pixel of an OLED display panel after the silicon island is formed in Embodiment 1 of the present invention. FIG. 2c is a cross-sectional schematic diagram of a second sub-pixel of an OLED display panel after the silicon island is formed in Embodiment 1 of the present invention.

Firstly, as shown in FIGS. 2a, 2b and 2c, a substrate 100 is provided. The substrate 100 is usually a transparent substrate. Specifically, the transparent substrate may be a hard substrate or a flexible substrate, such as a transparent glass substrate or a transparent plastic substrate. The transparent substrate may have a planar shape, a curved shape, or another irregular shape. It should be noted that, the material and shape of the transparent substrate are not limited herein.

Then, continuously referring to FIGS. 2a, 2b and 2c, a silicon island is formed on the substrate 100. A specific process of forming the silicon island is as follows: forming an amorphous silicon layer (a-Si) on the substrate 100 using a chemical vapor deposition (CVD) process; applying a process such as excimer laser annealing (ELA), solid phase crystallization (SPC) or metal induced crystallization (MIC) to the amorphous silicon layer so as to turn it into a polycrystalline silicon layer (P—Si); and performing a first photolithography process, and patterning the polycrystalline silicon layer to form the silicon island. The silicon island is used as an active layer for the first switch transistor T11, an active layer for the first drive transistor T12, an active layer for the second switch transistor T21, and an active layer for the second drive transistor T22. Specifically, the silicon island corresponds to positions of the respective sources and drains of the first switch transistor T11, the first drive transistor T12, the second switch transistor T21, and the second drive transistor T22.

Mainly referring to FIG. 2a, in this embodiment, the silicon island comprises a first segment 111-1, a second segment 111-2, a third segment 112-1, a fourth segment 112-2, a fifth segment 113 and a sixth segment 114. Each of the six segments substantially resumes a shape of a strip. The first segment 111-1, the second segment 111-2, the third segment 112-1, the fourth segment 112-2, and the fifth segment 113 extend in an X direction, while the sixth segment 114 extends in a Y direction. The first segment 111-1 and the third segment 112-1 are isolated strip structures. The first segment 111-1 is used as an active layer for the first switch transistor T11 in the first sub-pixel, and the third segment 112-1 is used as an active layer for the second switch transistor T21 in the second sub-pixel. Moreover, the first segment 111-1 and the third segment 112-1 are arranged in mirror symmetry. The fifth segment 113 is located between the second segment 111-2 and the fourth segment 112-2. The second segment 111-2 and the fourth segment 112-2 are arranged in mirror symmetry. The sixth segment 114 is connected to ends of the second segment 111-2, the fourth segment 112-2, and the fifth segment 113, to form an E-shaped structure. The second segment 111-2, the fourth segment 112-2, the fifth segment 113, and the sixth segment 114 jointly serve as an active layer for the first drive transistor T12 and the second drive transistor T22 (that is, the fifth segment 113 is shared by the two drive transistors).

It should be noted that, in other embodiments of the present invention, appropriate variations may be made to the shape of the silicon island. For example, the active layers of the first drive transistor T12 and the second drive transistor T22 may also be two U-shaped structures with the same opening direction (that is, the first drive transistor T12 and the second drive transistor T22 do not share an active layer). The present invention does not limit a specific shape of the silicon island.

Preferably, as shown in FIG. 2b and FIG. 2c, before the silicon island is formed on the substrate 100, a buffer layer 101 may be formed on the substrate 100 first, wherein the material of the buffer layer 101 may be, for example, silicon nitride or silicon oxide. After the silicon island is formed on the substrate 100, a second photolithography process is performed, to facilitate ion implantation into a predetermined region of the silicon island. As shown by the dotted boxes in FIG. 2a, ion implantation is performed on a drain region of the first switch transistor T11 and a drain region of the second switch transistor T21 in this embodiment, so that their conduction properties are improved.

FIG. 3a is a planar schematic diagram of a pixel group of an OLED display panel after a first through hole is formed in Embodiment 1 of the present invention. FIG. 3b is a cross-sectional schematic diagram of a first sub-pixel of an OLED display panel after the first through hole is formed in Embodiment 1 of the present invention. FIG. 3c is a cross-sectional schematic diagram of a second sub-pixel of an OLED display panel after the first through hole is formed in Embodiment 1 of the present invention.

As shown in FIGS. 3a, 3b and 3c, a gate insulative layer 120 is formed using a CVD process on the silicon island and the buffer layer 101 that is not covered, and a third photolithography process is performed, to open first through holes 120a-1 and 120a-2 in the gate insulative layer 120. The first through hole 120a-1 is located on one end of the first segment 111-1 of the silicon island, and is used to connect a drain D11 of the first switch transistor T11 and a lower plate C1-1 of the first storage capacitor C1 that are formed subsequently. The first through hole 120a-2 is located on one end of the third segment 112-1 of the silicon island, and is used to connect a drain D21 of the second switch transistor T21 and a lower plate C2-1 of the second storage capacitor C2 that are formed subsequently. In this embodiment, the material of the gate insulative layer 120 is, for example, oxide, nitride, or oxynitride. Apparently, other insulative materials may also be used to deposit the gate insulative layer 120, which are not limited in the present invention.

FIG. 4a is a planar schematic diagram of a pixel group of an OLED display panel after a first metal layer is formed (a fourth photolithography process) in Embodiment 1 of the present invention. FIG. 4b is a cross-sectional schematic diagram of a first sub-pixel of an OLED display panel after the first metal layer is formed in Embodiment 1 of the present invention. FIG. 4c is a cross-sectional schematic diagram of a second sub-pixel of an OLED display panel after the first metal layer is formed in Embodiment 1 of the present invention.

Then, as shown in FIGS. 4a, 4b and 4c, a first metal layer is formed on the gate insulative layer 120 using a sputtering or evaporation process. A fourth photolithography process is performed to pattern the first metal layer, so as to respectively form a gate G11 of the first switch transistor T11, a gate G12 of the first drive transistor T12, a gate G21 of the second switch transistor T21, a gate G22 of the second drive transistor T22, a scan line Sn, a first electrode (that is, the lower plate C1-1) of the first storage capacitor C1, and a first electrode (that is, the lower plate C2-1) of the second storage capacitor C2. A single-layer film made of metal such as Cr, W, Ti, Ta, Mo, Al, or Cu, or alloy may be used as the first metal layer; or a composite thin film formed by multi-layer metal thin films may also be used as the first metal layer.

Mainly referring to FIG. 4a, in this embodiment, the first electrode (that is, the lower plate C1-1) of the first storage capacitor C1 and the first electrode (that is, the lower plate C2-1) of the second storage capacitor C2 are symmetrically distributed. Preferably, they each have a shape of rectangle and have the same area. As shown in FIG. 4b and FIG. 4c, the drain D11 of the first switch transistor T11 is connected to the lower plate C1-1 of the first storage capacitor C1 via the first through hole 120a-1, and the drain D21 of the second switch transistor T21 is connected to the lower plate C2-1 of the second storage capacitor C2 via the first through hole 120a-2. It should be noted that, the gate G12 of the first drive transistor T12 and the lower plate C1-1 of the first storage capacitor C1 actually form an integral structure (as shown in FIG. 4a). However, to facilitate description of structural characteristics of the first drive transistor T12 and the first storage capacitor C1 in the following content, the gate G12 and the lower plate C1-1 are not shown as integrally connected in FIG. 4b. Likewise, the gate G22 of the second drive transistor T22 and the lower plate C2-1 of the second storage capacitor C2 actually form an integral structure (as shown in FIG. 4a). However, to facilitate following description of structural characteristics of the second drive transistor T22 and the second storage capacitor C2 in the following content, the gate G22 and the lower plate C2-1 are not shown as integrally connected in FIG. 4c.

FIG. 5a is a planar schematic diagram of a pixel group of an OLED display panel after a second through hole is formed (a fifth photolithography process) in Embodiment 1 of the present invention. FIG. 5b is a cross-sectional schematic diagram of a first sub-pixel of an OLED display panel after the second through hole is formed in Embodiment 1 of the present invention. FIG. 5c is a cross-sectional schematic diagram of a second sub-pixel of an OLED display panel after the second through hole is formed in Embodiment 1 of the present invention.

As shown in FIGS. 5a, 5b and 5c, a first interlayer insulative layer 140 is formed using a CVD process, and then a fifth photolithography process is performed to open a second through hole 140a-1 in the first interlayer insulative layer 140 and the gate insulative layer 120. The second through hole 140a-1 corresponds to a position of a source of the first switch transistor T11, and is used to enable an electrical connection between a first data line D1 and the source S11 of the first switch transistor T11 that are formed subsequently. Specifically, the second through hole 140a-1 is located on the other end of the first segment 111-1 of the silicon island, and penetrates the first interlayer insulative layer 140 and the gate insulative layer 120 above the first segment 111-1. In this embodiment, the material of the first interlayer insulative layer 140 is, for example, oxide, nitride, or oxynitride. Apparently, other insulative materials may also be used to deposit the first interlayer insulative layer 140, which are not limited in the present invention.

FIG. 6a is a planar schematic diagram of a pixel group of an OLED display panel after a second metal layer is formed (a sixth photolithography process) in Embodiment 1 of the present invention. FIG. 6b is a cross-sectional schematic diagram of a first sub-pixel of an OLED display panel after the second metal layer is formed in Embodiment 1 of the present invention. FIG. 6c is a cross-sectional schematic diagram of a second sub-pixel of an OLED display panel after the second metal layer is formed in Embodiment 1 of the present invention.

As shown in FIGS. 6a, 6b and 6c, a second metal layer is formed on the first interlayer insulative layer 140 using a sputtering or evaporation process. A sixth photolithography process is performed to pattern the second metal layer, so as to respectively form the first data line D1, a source S11 of the first switch transistor T11, and a second electrode (that is, the upper plate C2-2) of the second storage capacitor C2. A single-layer film made of metal such as Cr, W, Ti, Ta, Mo, Al, or Cu, or alloy may be used as the second metal layer; or a composite thin film formed by multi-layer metal thin films may also be used as the second metal layer. Mainly referring to FIG. 6a, in this embodiment, the first data line D1 is parallel to the upper plate C2-2 of the second storage capacitor C2. The first data line D1 and the source S11 of the first switch transistor T11 form an integral structure. The upper plate C2-2 of the second storage capacitor C2 has a shape of rectangle, and is located right above the lower plate C2-1 of the second storage capacitor C2. Finally, the second storage capacitor C2 is formed, which consists of the lower plate C2-1, the upper plate C2-2, and the first interlayer insulative layer 140 formed therebetween.

FIG. 7a is a planar schematic diagram of a pixel group of an OLED display panel after a third through hole is formed (a seventh photolithography process) in Embodiment 1 of the present invention. FIG. 7b is a cross-sectional schematic diagram of a first sub-pixel of an OLED display panel after the third through hole is formed in Embodiment 1 of the present invention. FIG. 7c is a cross-sectional schematic diagram of a second sub-pixel of an OLED display panel after the third through hole is formed in Embodiment 1 of the present invention.

As shown in FIGS. 7a, 7b and 7c, a second interlayer insulative layer 160 is formed using a CVD process, and then a seventh photolithography process is performed to open a third through hole 160a-2 in the second interlayer insulative layer 160, the first interlayer insulative layer 140 and the gate insulative layer 120. The third through hole 160a-2 corresponds to a position of a source of the second switch transistor T21, and is used to enable an electrical connection between a second data line D2 and the source S21 of the second switch transistor T21 that are formed subsequently. Specifically, the third through hole 160a-2 is located on the other end of the third segment 112-1 of the silicon island, that is, the third through hole 160a-2 penetrates the second interlayer insulative layer 160, the first interlayer insulative layer 140 and the gate insulative layer 120 that are above the third segment 112-1 of the silicon island. In this embodiment, the material of the second interlayer insulative layer 160 is, for example, oxide, nitride, or oxynitride. Apparently, other insulative materials may also be used to deposit the second interlayer insulative layer 160, which are not limited in the present invention.

In a preferred solution, in order to make the first storage capacitor C1 and the second storage capacitor C2 have the same capacitance value, an eighth photolithography process is performed after the third through hole 160a-2 is formed, to form an opening 160b that exactly faces the lower plate C1-1 of the first storage capacitor C1 in the second interlayer insulative layer 160. That is, the second interlayer insulative layer 160 above the lower plate C1-1 of the first storage capacitor C1 is removed, so that dielectric layers of the first storage capacitor C1 and the second storage capacitor C2 are of the same thickness. That is, the first storage capacitor C1 and the second storage capacitor C2 both use the first interlayer insulative layer 140 as the dielectric layer. It can be understood that, the present invention does not limit a forming sequence of the third through hole 160a-2 and the opening 160b. In other embodiments of the present invention, the opening 160b may also be formed prior to the formation of the third through hole 160a-2. Further, the formation of the opening 160b can be omitted. Another manner such as increasing the area of the plate of the first storage capacitor may also be used to make the capacitance values of the first storage capacitor C1 and the second storage capacitor C2 equal.

FIG. 8a is a planar schematic diagram of a pixel group of an OLED display panel after a third metal layer is formed (a ninth photolithography process) in Embodiment 1 of the present invention. FIG. 8b is a cross-sectional schematic diagram of a first sub-pixel of an OLED display panel after the third metal layer is formed in Embodiment 1 of the present invention. FIG. 8c is a cross-sectional schematic diagram of a second sub-pixel of an OLED display panel after the third metal layer is formed in Embodiment 1 of the present invention.

As shown in FIGS. 8a, 8b and 8c, a third metal layer is formed on the second interlayer insulative layer 160 using a sputtering or evaporation process. A ninth photolithography process is performed to pattern the third metal layer, so as to respectively form the second data line D2, a source S21 of the second switch transistor T21, and a second electrode (that is, the upper plate C1-2) of the first storage capacitor C1. In this embodiment, the first data line D1 and the upper plate C1-2 of the first storage capacitor C1 are not located on the same layer (that is, they are located on different structural layers), and the second data line D2 and the upper plate C2-2 of the second storage capacitor C2 are not located on the same layer (that is, they are located on different structural layers), thus reducing an in-layer distance (which, herein, refers to a distance between a data line and an upper plate of a storage capacitor that are on the same layer). Consequently, the pixel area is reduced, the PPI of the OLED display panel is improved, and the resolution of the OLED display panel is enhanced. A single-layer film made of metal such as Cr, W, Ti, Ta, Mo, Al, or Cu, or alloy may be used as the third metal layer; or a composite thin film formed by multi-layer metal thin films may also be used as the third metal layer. Mainly referring to FIG. 8a, in this embodiment, the second electrode (that is, the upper plate C1-2) of the first storage capacitor C1 and the second electrode (that is, the upper plate C2-2) of the second storage capacitor C2 are symmetrically distributed. Preferably, each of them has a shape of rectangle. Mainly referring to FIG. 8b and FIG. 8c, the second data line D2 is parallel to the upper plate C1-2 of the first storage capacitor C1. The second data line D2 and the source S21 of the second switch transistor T21 actually form an integral structure, and the upper plate C1-2 of the first storage capacitor C1 is located right above the lower plate C1-1 of the first storage capacitor C1. In addition, the lower plate C1-1 of the first storage capacitor C1 and the lower plate C2-1 of the second storage capacitor C2 have the same area, and the upper plate C1-2 of the first storage capacitor C1 and the upper plate C2-2 of the second storage capacitor C2 have the same area.

FIG. 9a is a planar schematic diagram of a pixel group of an OLED display panel after a fourth through hole is formed (a tenth photolithography process) in Embodiment 1 of the present invention. FIG. 9b is a cross-sectional schematic diagram of a first sub-pixel of an OLED display panel after the fourth through hole is formed in Embodiment 1 of the present invention. FIG. 9c is a cross-sectional schematic diagram of a second sub-pixel of an OLED display panel after the fourth through hole is formed in Embodiment 1 of the present invention.

As shown in FIGS. 9a, 9b and 9c, a third interlayer insulative layer 180 is formed using a CVD process, and a ninth photolithography process is performed, to open fourth through holes 180a, 180a-1, 180a-2, 180a-3, and 180a-4 in the third interlayer insulative layer 180. The fourth through holes are used to enable electrical connections of a source to a drain of the first drive transistor T12, a source to a drain of the second drive transistor T22, the power line VDD, the upper plate C1-2 of the first storage capacitor C1 to the upper plate C2-2 of the second storage capacitor C2.

Specifically, the fourth through 180a corresponds to a position of a source of the first drive transistor T12 and a source of the second drive transistor T22, and penetrates the gate insulative layer 120, the first interlayer insulative layer 140, the second interlayer insulative layer 160, and the third interlayer insulative layer 180 that are above the fifth segment 113 (that is, the active layer 113) of the silicon island. The fourth through 180a-1 corresponds to a position of a drain of the first drive transistor T12, and penetrates the gate insulative layer 120, the first interlayer insulative layer 140, the second interlayer insulative layer 160, and the third interlayer insulative layer 180 that are above the second segment 111-2 (that is, the active layer 111-2) of the silicon island. The fourth through 180a-2 corresponds to a position of a drain of the second drive transistor T22, and penetrates the gate insulative layer 120, the first interlayer insulative layer 140, the second interlayer insulative layer 160, and the third interlayer insulative layer 180 that are above the fourth segment 112-2 (that is, the active layer 112-2) of the silicon island. The fourth through hole 180a-3 is located above the first storage capacitor C1, and penetrates the third interlayer insulative layer 180 that is above the upper plate C1-2 of the first storage capacitor C1. The fourth through hole 180a-4 is located above the second storage capacitor C2, and penetrates the second interlayer insulative layer 160 and the third interlayer insulative layer 180 that are above the upper plate C2-2 of the second storage capacitor C2. In this embodiment, the material of the third interlayer insulative layer 180 is, for example, oxide, nitride, or oxynitride. Apparently, other insulative materials may also be used to deposit the third interlayer insulative layer 180, which are not limited in the present invention.

FIG. 10a is a planar schematic diagram of a pixel group of an OLED display panel after a fourth metal layer is formed in Embodiment 1 of the present invention. FIG. 10b is a cross-sectional schematic diagram of a first sub-pixel of an OLED display panel after the fourth metal layer is formed in Embodiment 1 of the present invention. FIG. 10c is a cross-sectional schematic diagram of a second sub-pixel of an OLED display panel after the fourth metal layer is formed in Embodiment 1 of the present invention.

As shown in FIGS. 10a, 10b and 10c, a fourth metal layer is formed on the third interlayer insulative layer 180 using a sputtering or evaporation process. An eleventh photolithography process is performed to pattern the fourth metal layer, so as to form a source S12 and a drain D12 of the first drive transistor T12, a source S22 and a drain D22 of the second drive transistor T22, and the power line VDD. A single-layer film made of metal such as Cr, W, Ti, Ta, Mo, Al, or Cu, or alloy may be used as the fourth metal layer; or a composite thin film formed by multi-layer metal thin films may also be used as the fourth metal layer. Mainly referring to FIG. 10a, in this embodiment, the fourth metal layer is located above the first storage capacitor C1 and the second storage capacitor C2. The power line VDD, the source S12 of the first drive transistor T12, and the source S22 of the second drive transistor T22 actually form an integral structure. More specifically, the first drive transistor T12 and the second drive transistor T22 share a source. The drain D12 of the first drive transistor T12 and the drain D22 of the second drive transistor T22 are arranged in mirror symmetry with respect to the power line VDD. Likewise, the first storage capacitor C1 and the second storage capacitor C2 also are arranged in mirror symmetry with respect to the power line VDD.

FIG. 11a is a planar schematic diagram of a pixel group of an OLED display panel after a contact hole is formed in Embodiment 1 of the present invention. FIG. 11b is a cross-sectional schematic diagram of a first sub-pixel of an OLED display panel after the contact hole is formed in Embodiment 1 of the present invention. FIG. 11c is a cross-sectional schematic diagram of a second sub-pixel of an OLED display panel after the contact hole is formed in Embodiment 1 of the present invention.

As shown in FIGS. 11a, 11b and 11c, a passivated insulative layer 200 is formed using a CVD process on the power line VDD and the third interlayer insulative layer 180 that is not covered by the power line VDD, and a twelfth photolithography process is performed, to form contact holes 200a-1 and 200a-2 in the passivated insulative layer 200. The contact holes 200a-1 and 200a-2 correspond to positions of the drains of the first drive transistor T12 and the second drive transistor T22. Specifically, the contact holes penetrate the passivated insulative layer 200 above the drains of the first drive transistor T12 and the second drive transistor T22. In this embodiment, the material of the passivated insulative layer 200 is, for example, oxide, nitride, or oxynitride. Apparently, other insulative materials may also be used to deposit the passivated insulative layer 200, which are not limited in the present invention.

Then, as shown in FIGS. 12a, 12b and 12c, an electrode layer is formed on the passivated insulative layer 200 using a sputtering or evaporation process. A thirteenth photolithography process is performed to pattern the electrode layer, so as to form an anode 221 of a first OLED and an anode 222 of a second OLED. The anode 221 of the first OLED is electrically connected to the drain D12 of the first drive transistor T12 through the contact hole 200a-1. The anode 222 of the second OLED is electrically connected to the drain D22 of the second drive transistor T22 through the contact hole 200a-2. The electrode layer may be made by using one or more of the following materials: indium tin oxide, zinc oxide, indium zinc oxide, silver, gold, and aluminum.

Continuously referring to FIG. 12b, the source S12 of the first drive transistor T12 is electrically connected to the active layer 112-1 of the first drive transistor T12 via the fourth through hole 180a. In addition, the source S12 of the first drive transistor T12 is electrically connected to the power line VDD and the second electrode (that is, the upper plate C1-2) of the first storage capacitor C1 via the fourth through hole 180a-3.

Continuously referring to FIG. 12c, the source S22 of the second drive transistor T22 is electrically connected to the active layer 112-2 of the second drive transistor T22 via the fourth through hole 180a. In addition, the source S22 of the second drive transistor T22 is electrically connected to the power line VDD and the second electrode (that is, the upper plate C2-2) of the second storage capacitor C2 via the fourth through hole 180a-4.

Further, after the anode 221 of the first OLED and the anode 222 of the second OLED are formed, a pixel restriction layer may be further formed using a conventional process. A light-emitting layer and a cathode may also be formed subsequently using the conventional process, to complete manufacture of the OLED device. Details are not described herein.

To sum up, in the OLED display panel of this embodiment, two sub-pixels form a group, and are arranged in mirror symmetry with respect to the power line VDD. The data lines respectively connected to the two sub-pixels in the same pixel group are located on different structural layers. Therefore, a distance between adjacent data lines on the same layer is doubled without reducing the pixel area, and adjacent data lines on different layers are isolated by an interlayer insulative layer, thus effectively reducing the probability of occurrence of a short circuit between data lines. Moreover, crosstalk between the data lines is significantly eliminated during use, which not only enhances the product yield, but also improves the image quality of the product. Moreover, because the data lines correspondingly connected to the two sub-pixels in the same pixel group are disposed on different structural layers, the pixel area can be reduced based on existing apparatuses and process conditions, improving the PPI of the OLED display panel, and enhancing the resolution of the OLED display panel. In addition, a first data line D1 and an upper plate C1-2 of the first storage capacitor C1 are located on different layers, and a second data line D2 and an upper plate C2-2 of the second storage capacitor C2 are located on different layers. For example, the first data line D1 and the upper plate C2-2 of the second storage capacitor C2 are formed together, while the second data line D2 and the upper plate C1-2 of the first storage capacitor C1 are formed together. Therefore, a distance between a data line and an upper plate of a storage capacitor that are on the same layer can be reduced, thus further reducing the pixel area, improving the PPI of the OLED display panel, and enhancing the resolution of the OLED display panel.

Embodiment 2

In this embodiment, the upper plate C1-2 of the first storage capacitor C1 and the upper plate C2-2 of the second storage capacitor C2 form an integral structure through a process in one attempt.

Figure 19A:
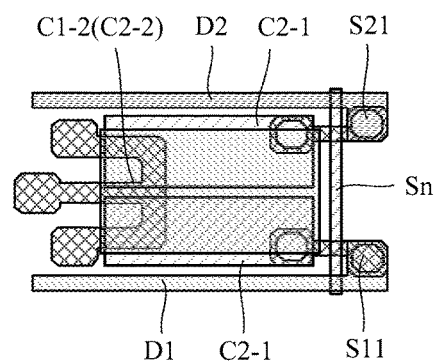
FIG. 19a is a planar schematic diagram of a pixel group of an OLED display panel after a third metal layer is formed in Embodiment 2 of the present invention.
Figure 20A:
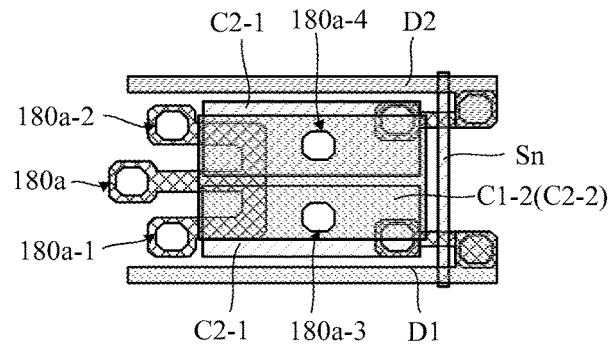
FIG. 20a is a planar schematic diagram of a pixel group of an OLED display panel after a fourth through hole is formed in Embodiment 2 of the present invention.
Figure 21A:
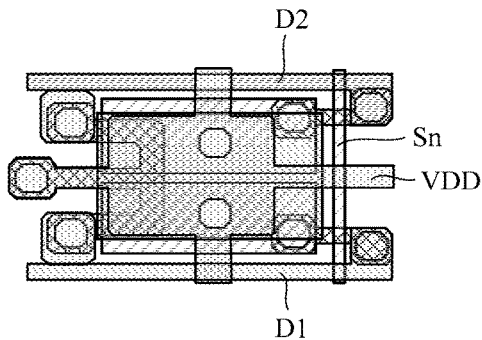
FIG. 21a is a planar schematic diagram of a pixel group of an OLED display panel after a fourth metal layer is formed in Embodiment 2 of the present invention.

Continuously referring to FIGS. 19a, 20a, and 21a, the first data line D1, the second data line D2, and the power line VDD are parallel to each other. The scan line Sn is perpendicular to the power line VDD. Moreover, the first data line D1 and the second data line D2 are arranged in mirror symmetry with respect to the power line VDD. In addition, the first storage capacitor C1 and the second storage capacitor C2 are arranged in mirror symmetry with respect to the power line VDD; the first switch transistor T11 and the second switch transistor T21 are arranged in mirror symmetry with respect to the power line VDD; and the first drive transistor T12 and the second drive transistor T22 are arranged in mirror symmetry with respect to the power line VDD.

Specifically, in this embodiment, the upper plate C1-2 of the first storage capacitor C1 and the upper plate C2-2 of the second storage capacitor C2 form an integral structure and are both in a shape of rectangle. The lower plate C1-1 of the first storage capacitor C1 and the lower plate C2-1 of the second storage capacitor C2 are also in a shape of rectangle.

The technical solution of this embodiment is further described below with reference to the planar top views and cross-sectional schematic diagrams of a manufacturing process of a TFT-LCD array substrate according to Embodiment 1 of the present invention.

Figure 13A:
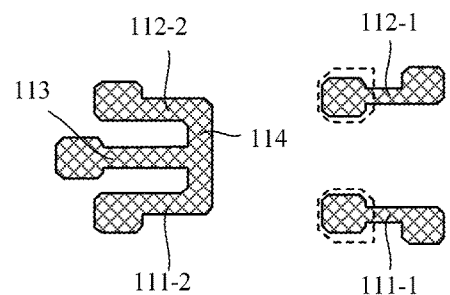
FIG. 13a is a planar schematic diagram of a pixel group of an OLED display panel after a silicon island is formed in Embodiment 2 of the present invention.
Figure 13B:
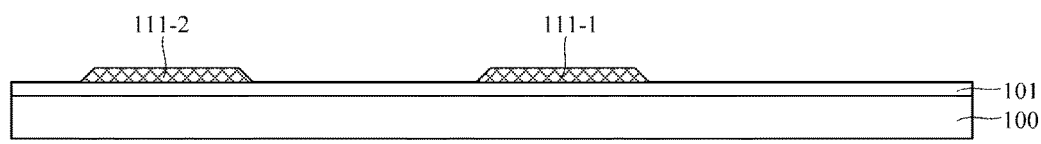
FIG. 13b is a cross-sectional schematic diagram of a first sub-pixel of an OLED display panel after the silicon island is formed in Embodiment 2 of the present invention.
Figure 13C:
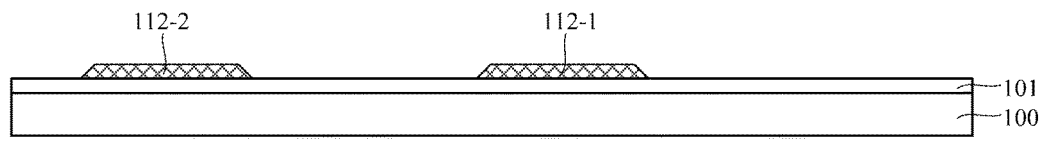
FIG. 13c is a cross-sectional schematic diagram of a second sub-pixel of an OLED display panel after the silicon island is formed in Embodiment 2 of the present invention.

FIG. 13a is a planar schematic diagram of a pixel group of an OLED display panel after a silicon island is formed in Embodiment 2 of the present invention. FIG. 13b is a cross-sectional schematic diagram of a first sub-pixel of an OLED display panel after the silicon island is formed in Embodiment 2 of the present invention. FIG. 13c is a cross-sectional schematic diagram of a second sub-pixel of an OLED display panel after the silicon island is formed in Embodiment 2 of the present invention.

As shown in FIGS. 13a, 13b and 13c, a substrate 100 is provided. Then, a silicon island is formed on the substrate 100. The silicon island is used as an active layer for the first switch transistor T11, the first drive transistor T12, the second switch transistor T21, and the second drive transistor T22. In this embodiment, before the silicon island is formed on the substrate 100, a buffer layer 101 is formed on the substrate 100 first. Preferably, after the silicon island is formed on the substrate 100, a second photolithography process is performed, to conduct ion implantation into a predetermined region of the silicon island.

Figure 14A:
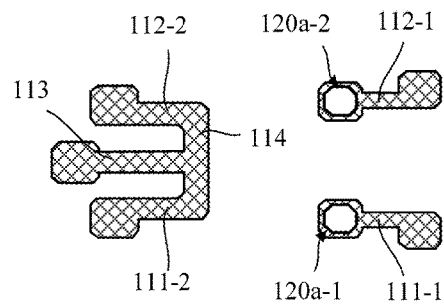
FIG. 14a is a planar schematic diagram of a pixel group of an OLED display panel after a first through hole is formed in Embodiment 2 of the present invention.
Figure 14B:
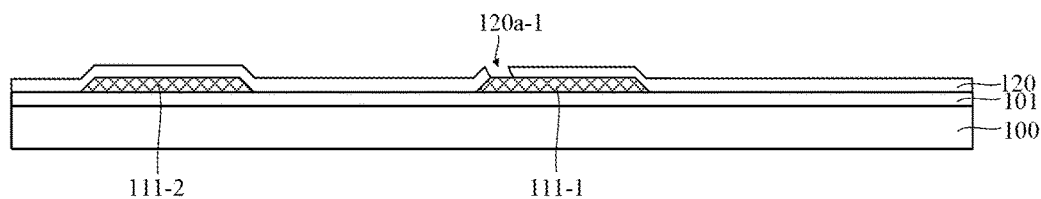
FIG. 14b is a cross-sectional schematic diagram of a first sub-pixel of an OLED display panel after the first through hole is formed in Embodiment 2 of the present invention.
Figure 14C:
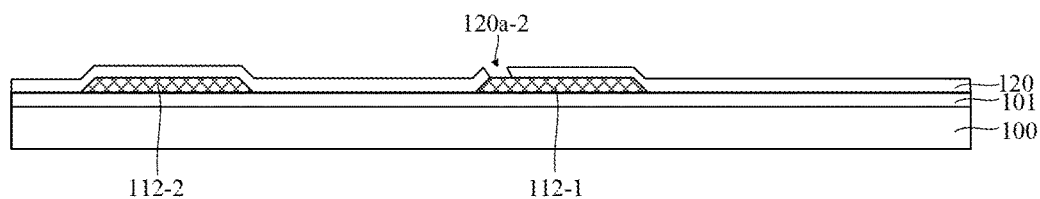
FIG. 14c is a cross-sectional schematic diagram of a second sub-pixel of an OLED display panel after the first through hole is formed in Embodiment 2 of the present invention.

FIG. 14a is a planar schematic diagram of a pixel group of an OLED display panel after a first through hole is formed in Embodiment 2 of the present invention. FIG. 14b is a cross-sectional schematic diagram of a first sub-pixel of an OLED display panel after the first through hole is formed in Embodiment 2 of the present invention. FIG. 14c is a cross-sectional schematic diagram of a second sub-pixel of an OLED display panel after the first through hole is formed in Embodiment 2 of the present invention As shown in FIGS. 14a, 14b and 14c, a gate insulative layer 120 is formed using a CVD process on the silicon island and the buffer layer 101 that is not covered, and a third photolithography process is performed to open first through holes 120a-1 and 120a-2 in the gate insulative layer 120.

Figure 15A:
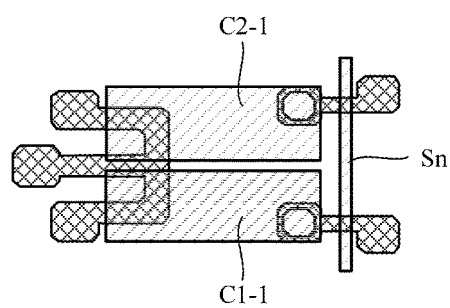
FIG. 15a is a planar schematic diagram of a pixel group of an OLED display panel after a first metal layer is formed in Embodiment 2 of the present invention.
Figure 15B:
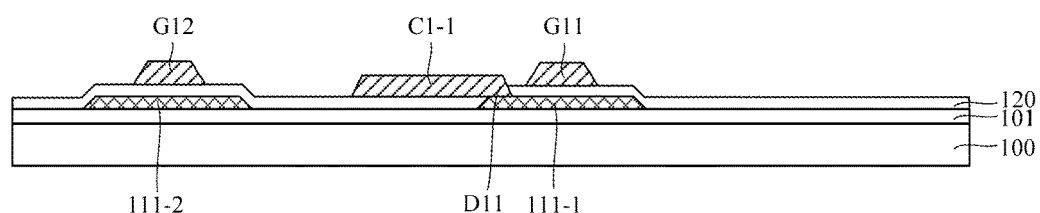
FIG. 15b is a cross-sectional schematic diagram of a first sub-pixel of an OLED display panel after the first metal layer is formed in Embodiment 2 of the present invention.
Figure 15C:
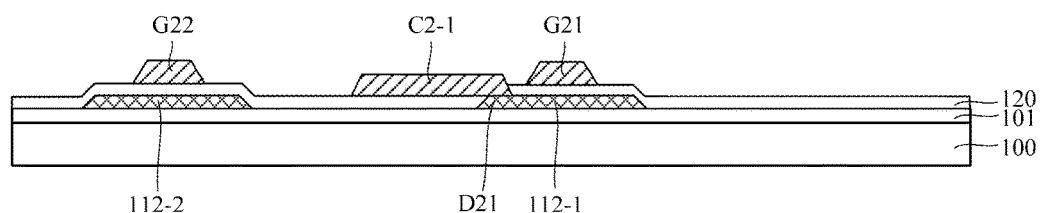
FIG. 15c is a cross-sectional schematic diagram of a second sub-pixel of an OLED display panel after the first metal layer is formed in Embodiment 2 of the present invention.

FIG. 15a is a planar schematic diagram of a pixel group of an OLED display panel after a first metal layer is formed in Embodiment 2 of the present invention. FIG. 15b is a cross-sectional schematic diagram of a first sub-pixel of an OLED display panel after the first metal layer is formed in Embodiment 2 of the present invention. FIG. 15c is a cross-sectional schematic diagram of a second sub-pixel of an OLED display panel after the first metal layer is formed in Embodiment 2 of the present invention.

As shown in FIGS. 15a, 15b and 15c, a first metal layer is formed on the gate insulative layer 120 using a sputtering or evaporation process. A fourth photolithography process is performed to pattern the first metal layer, so as to respectively form a gate G11 of the first switch transistor T11, a gate G12 of the first drive transistor T12, a gate G21 of the second switch transistor T21, a gate G22 of the second drive transistor T22, a scan line Sn, a first electrode (that is, the lower plate C1-1) of the first storage capacitor C1, and a first electrode (that is, the lower plate C2-1) of the second storage capacitor C2.

Figure 16A:
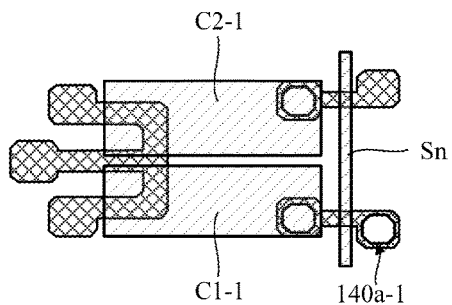
FIG. 16a is a planar schematic diagram of a pixel group of an OLED display panel after a second through hole is formed in Embodiment 2 of the present invention.
Figure 16B:
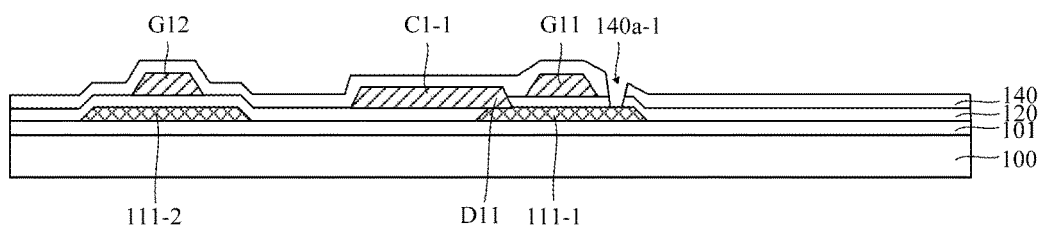
FIG. 16b is a cross-sectional schematic diagram of a first sub-pixel of an OLED display panel after the second through hole is formed in Embodiment 2 of the present invention.
Figure 16C:
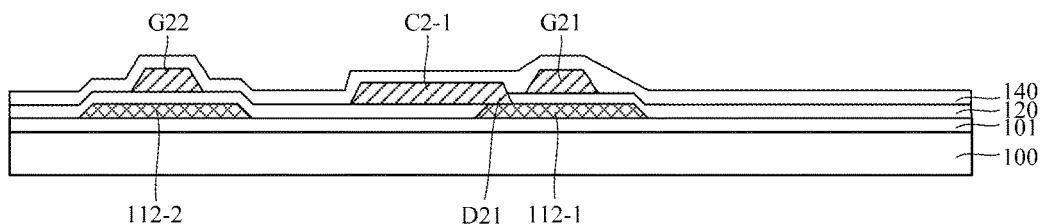
FIG. 16c is a cross-sectional schematic diagram of a second sub-pixel of an OLED display panel after the second through hole is formed in Embodiment 2 of the present invention.

FIG. 16a is a planar schematic diagram of a pixel group of an OLED display panel after a second through hole is formed in Embodiment 2 of the present invention. FIG. 16b is a cross-sectional schematic diagram of a first sub-pixel of an OLED display panel after the second through hole is formed in Embodiment 2 of the present invention. FIG. 16c is a cross-sectional schematic diagram of a second sub-pixel of an OLED display panel after the second through hole is formed in Embodiment 2 of the present invention.

As shown in FIGS. 16a, 16b and 16c, a first interlayer insulative layer 140 is formed using a CVD process, and a fifth photolithography process is performed to open the second through hole 140a-1 in the first interlayer insulative layer 140 and the gate insulative layer 120. The second through hole 140a-1 corresponds to a position of a source of the first switch transistor T11, and is used to enable an electrical connection between a first data line D1 and the source S11 of the first switch transistor T11 that are formed subsequently.

Figure 17A:
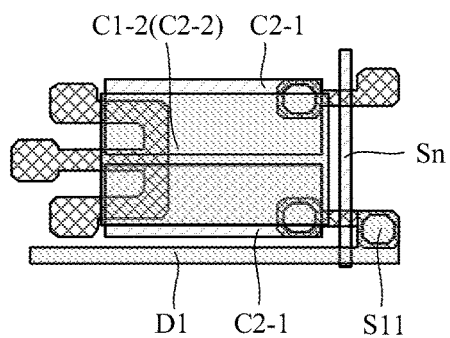
FIG. 17a is a planar schematic diagram of a pixel group of an OLED display panel after a second metal layer is formed in Embodiment 2 of the present invention.
Figure 17B:
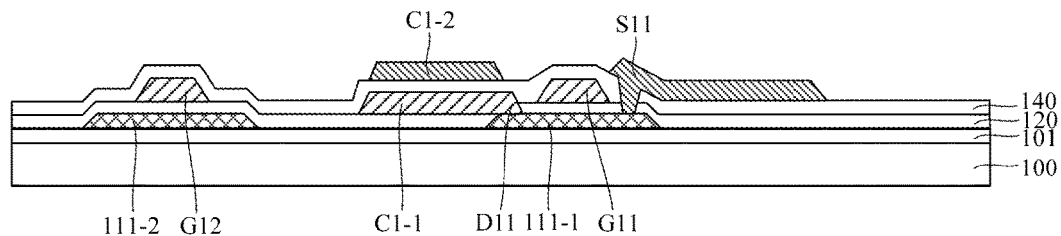
FIG. 17b is a cross-sectional schematic diagram of a first sub-pixel of an OLED display panel after the second metal layer is formed in Embodiment 2 of the present invention.
Figure 17C:
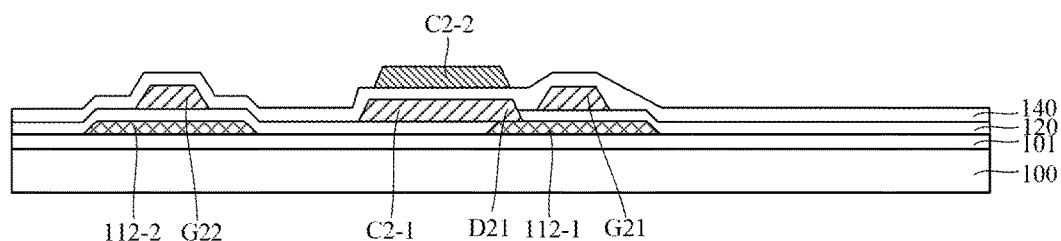
FIG. 17c is a cross-sectional schematic diagram of a second sub-pixel of an OLED display panel after the second metal layer is formed in Embodiment 2 of the present invention.

FIG. 17a is a planar schematic diagram of a pixel group of an OLED display panel after a second metal layer is formed in Embodiment 2 of the present invention. FIG. 17b is a cross-sectional schematic diagram of a first sub-pixel of an OLED display panel after the second metal layer is formed in Embodiment 2 of the present invention. FIG. 17c is a cross-sectional schematic diagram of a second sub-pixel of an OLED display panel after the second metal layer is formed in Embodiment 2 of the present invention.

As shown in FIGS. 17a, 17b and 17c, a second metal layer is formed on the first interlayer insulative layer 140 using a sputtering or evaporation process. A sixth photolithography process is performed to pattern the second metal layer, so as to form the first data line D1, a source S11 of the first switch transistor T11, a second electrode (that is, the upper plate C1-2) of the first storage capacitor C1, and a second electrode (that is, the upper plate C2-2) of the second storage capacitor C2.

Mainly referring to FIG. 17a, a difference between this embodiment and Embodiment 1 lies in that, the upper plate C1-2 of the first storage capacitor C1 and the upper plate C2-2 of the second storage capacitor C2 form an integral structure through a process in one attempt. As the upper plates of the first storage capacitor C1 and the second storage capacitor C2 are formed at the same time, thus there is no need to additionally form an opening to ensure equal capacitance values of the first storage capacitor C1 and the second storage capacitor C2. Therefore, compared with the solution in Embodiment 1, this solution has simpler process and lower costs.

Figure 18A:
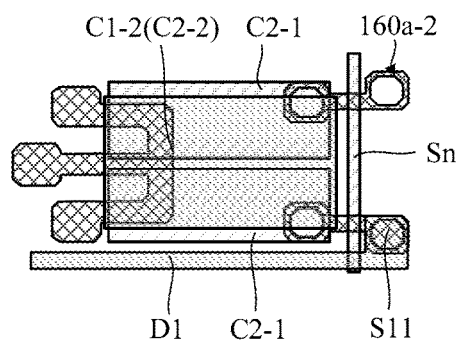
FIG. 18a is a planar schematic diagram of a pixel group of an OLED display panel after a third through hole is formed in Embodiment 2 of the present invention.
Figure 18B:
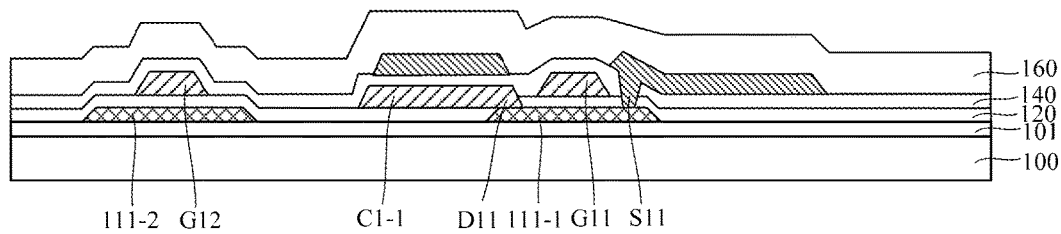
FIG. 18b is a cross-sectional schematic diagram of a first sub-pixel of an OLED display panel after the third through hole is formed in Embodiment 2 of the present invention.
Figure 18C:
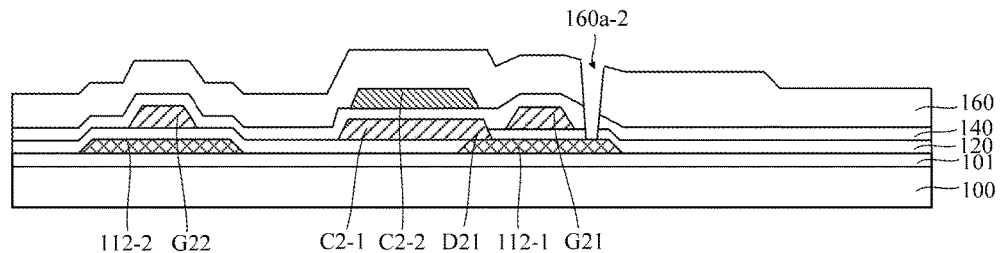
FIG. 18c is a cross-sectional schematic diagram of a second sub-pixel of an OLED display panel after the third through hole is formed in Embodiment 2 of the present invention.

FIG. 18a is a planar schematic diagram of a pixel group of an OLED display panel after a third through hole is formed in Embodiment 2 of the present invention. FIG. 18b is a cross-sectional schematic diagram of a first sub-pixel of an OLED display panel after the third through hole is formed in Embodiment 2 of the present invention. FIG. 18c is a cross-sectional schematic diagram of a second sub-pixel of an OLED display panel after the third through hole is formed in Embodiment 2 of the present invention.

As shown in FIGS. 18a, 18b and 18c, a second interlayer insulative layer 160 is formed using a CVD process, and a seventh photolithography process is performed to open the third through hole 160a-2 in the second interlayer insulative layer 160, the first interlayer insulative layer 140 and the gate insulative layer 120. The third through hole 160a-2 corresponds to a position of a source of the second switch transistor T21, and is used to enable an electrical connection of a second data line D2 and the source S21 of the second switch transistor T21 that are formed subsequently.

Figure 19B:
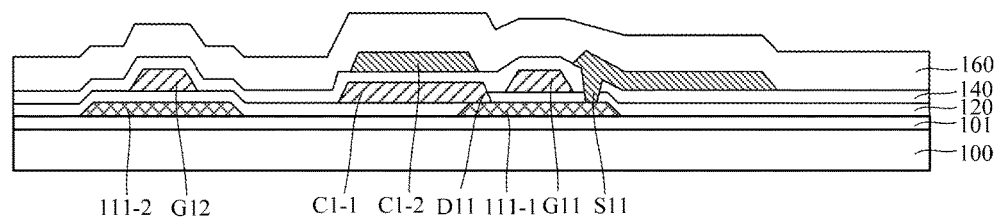
FIG. 19b is a cross-sectional schematic diagram of a first sub-pixel of an OLED display panel after the third metal layer is formed in Embodiment 2 of the present invention.
Figure 19C:
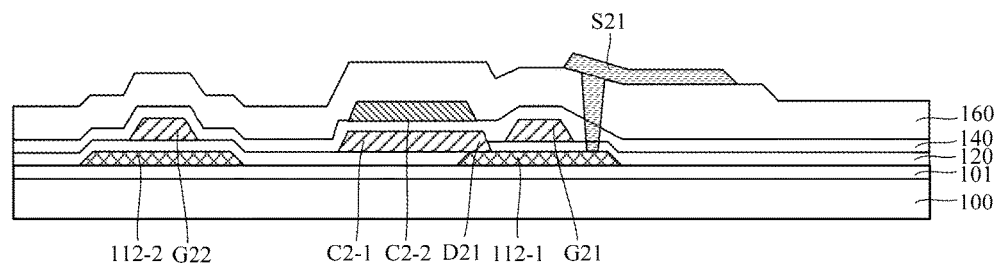
FIG. 19c is a cross-sectional schematic diagram of a second sub-pixel of an OLED display panel after the third metal layer is formed in Embodiment 2 of the present invention.

FIG. 19a is a planar schematic diagram of a pixel group of an OLED display panel after a third metal layer is formed in Embodiment 2 of the present invention. FIG. 19b is a cross-sectional schematic diagram of a first sub-pixel of an OLED display panel after the third metal layer is formed in Embodiment 2 of the present invention. FIG. 19c is a cross-sectional schematic diagram of a second sub-pixel of an OLED display panel after the third metal layer is formed in Embodiment 2 of the present invention.

As shown in FIGS. 19a, 19b and 19c, a third metal layer is formed on the second interlayer insulative layer 160 using a sputtering or evaporation process. An eighth photolithography process is performed to pattern the third metal layer, so as to form the second data line D2 and a source S21 of the second switch transistor T21. In this embodiment, the second data line D2 and the source S21 of the second switch transistor T21 form an integral structure.

Figure 20B:
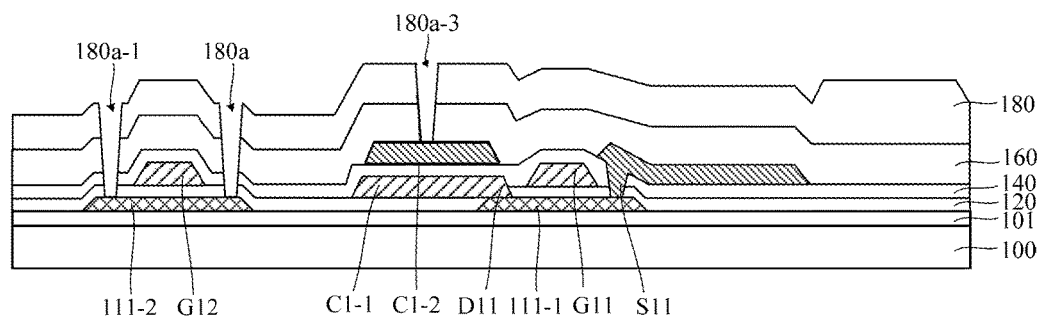
FIG. 20b is a cross-sectional schematic diagram of a first sub-pixel of an OLED display panel after the fourth through hole is formed in Embodiment 2 of the present invention.
Figure 20C:
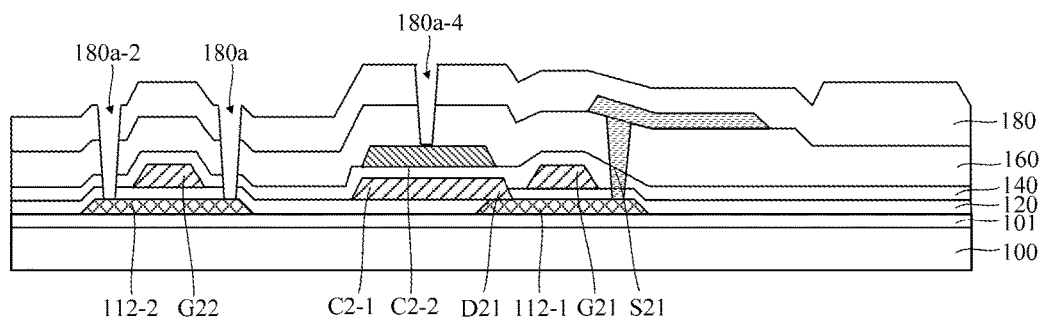
FIG. 20c is a cross-sectional schematic diagram of a second sub-pixel of an OLED display panel after the fourth through hole is formed in Embodiment 2 of the present invention.

FIG. 20a is a planar schematic diagram of a pixel group of an OLED display panel after a fourth through hole is formed in Embodiment 2 of the present invention. FIG. 20b is a cross-sectional schematic diagram of a first sub-pixel of an OLED display panel after the fourth through hole is formed in Embodiment 2 of the present invention. FIG. 20c is a cross-sectional schematic diagram of a second sub-pixel of an OLED display panel after the fourth through hole is formed in Embodiment 2 of the present invention.

As shown in FIGS. 20a, 20b and 20c, a third interlayer insulative layer 180 is formed using a CVD process, and an eighth photolithography process is performed to open fourth through holes 180a, 180a-1, 180a-2, 180a-3, and 180a-4 in the third interlayer insulative layer 180. The fourth through holes are used to enable electrical connections of a source to a drain of the first drive transistor T12, a source to a drain of the second drive transistor T22, the power line VDD, the upper plate C1-2 of the first storage capacitor C1 to the upper plate C2-2 of the second storage capacitor C2.

Figure 21B:
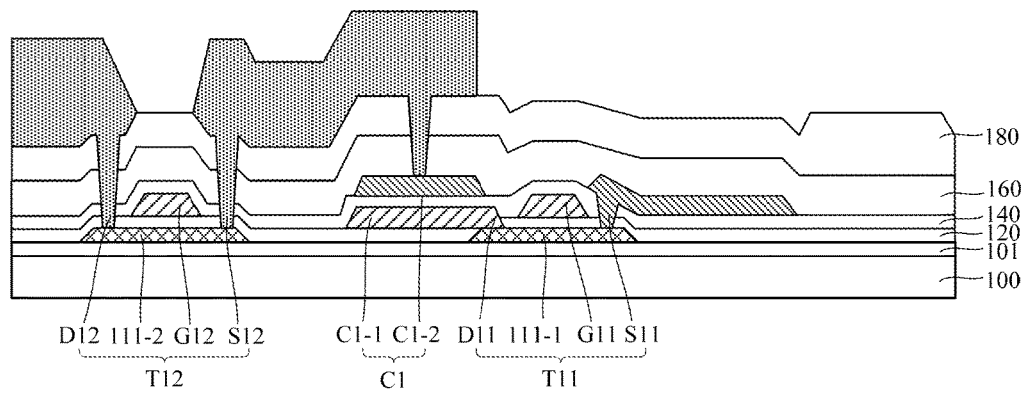
FIG. 21b is a cross-sectional schematic diagram of a first sub-pixel of an OLED display panel after the fourth metal layer is formed in Embodiment 2 of the present invention.
Figure 21C:
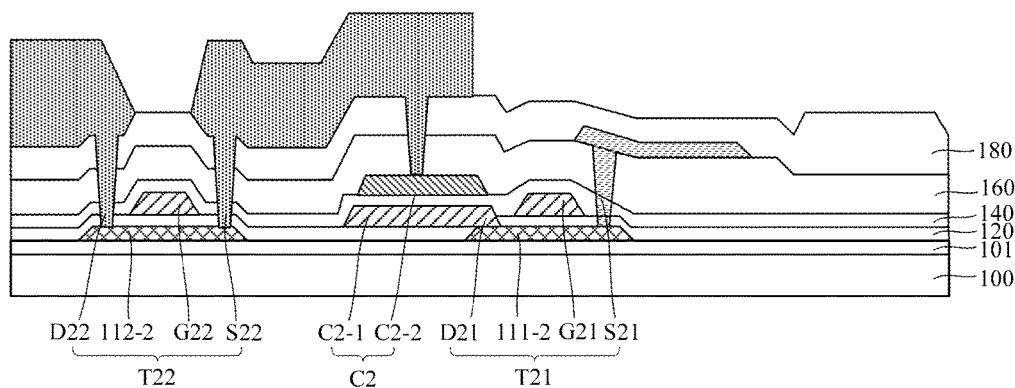
FIG. 21c is a cross-sectional schematic diagram of a second sub-pixel of an OLED display panel after the fourth metal layer is formed in Embodiment 2 of the present invention.

FIG. 21a is a planar schematic diagram of a pixel group of an OLED display panel after a fourth metal layer is formed in Embodiment 2 of the present invention. FIG. 21b is a cross-sectional schematic diagram of a first sub-pixel of an OLED display panel after the fourth metal layer is formed in Embodiment 2 of the present invention. FIG. 21c is a cross-sectional schematic diagram of a second sub-pixel of an OLED display panel after the fourth metal layer is formed in Embodiment 2 of the present invention.

As shown in FIGS. 21a, 21b and 21c, a fourth metal layer is formed on the third interlayer insulative layer 180 using a sputtering or evaporation process. A tenth photolithography process is performed to pattern the fourth metal layer, so as to form a source S12 and a drain D12 of the first drive transistor T12, a source S22 and a drain D22 of the second drive transistor T22, and the power line VDD.

Figure 22A:
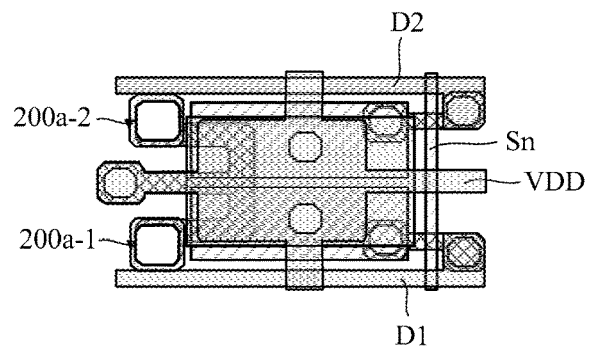
FIG. 22a is a planar schematic diagram of a pixel group of an OLED display panel after a contact hole is formed in Embodiment 2 of the present invention.
Figure 22B:
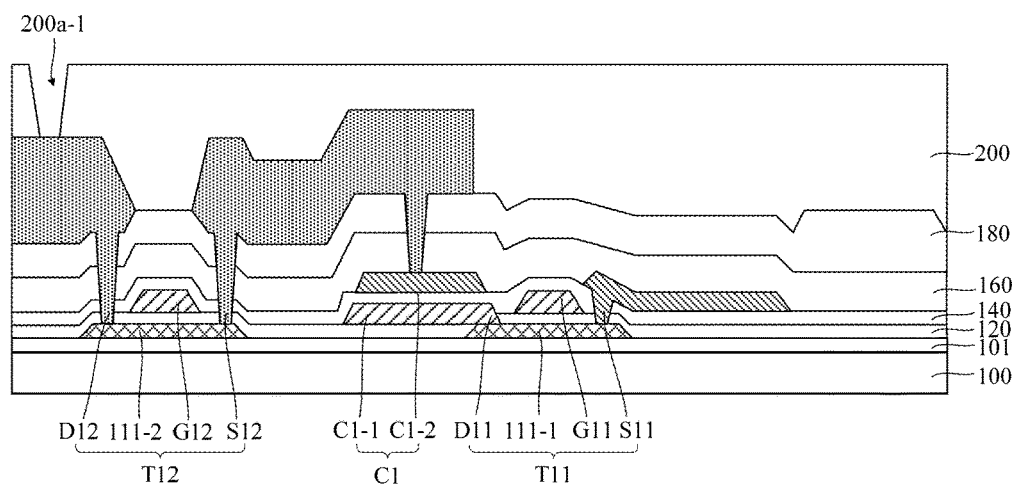
FIG. 22b is a cross-sectional schematic diagram of a first sub-pixel of an OLED display panel after the contact hole is formed in Embodiment 2 of the present invention.
Figure 22C:
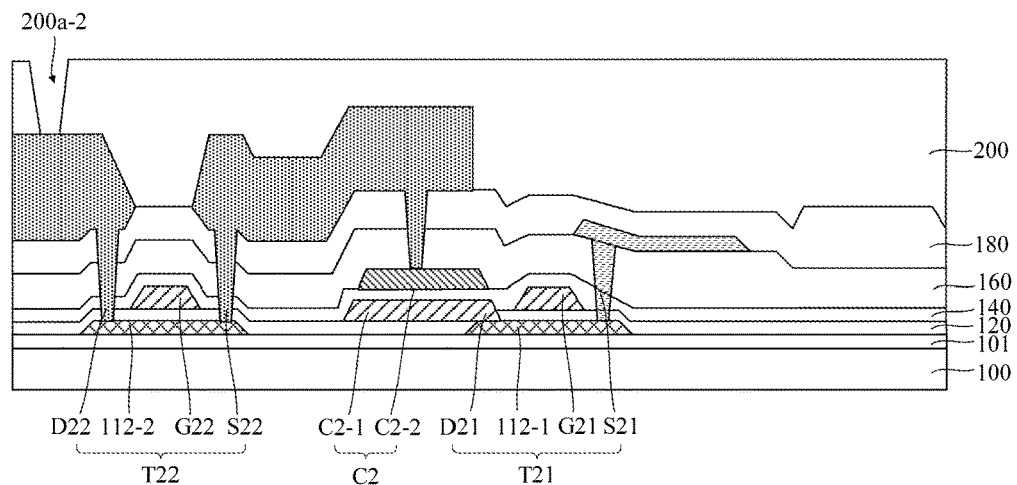
FIG. 22c is a cross-sectional schematic diagram of a second sub-pixel of an OLED display panel after the contact hole is formed in Embodiment 2 of the present invention.

FIG. 22a is a planar schematic diagram of a pixel group of an OLED display panel after a contact hole is formed in Embodiment 2 of the present invention. FIG. 22b is a cross-sectional schematic diagram of a first sub-pixel of an OLED display panel after the contact hole is formed in Embodiment 2 of the present invention. FIG. 22c is a cross-sectional schematic diagram of a second sub-pixel of an OLED display panel after the contact hole is formed in Embodiment 2 of the present invention.

As shown in FIGS. 22a, 22b and 22c, a passivated insulative layer 200 is formed using a CVD process on the power line VDD and the third interlayer insulative layer 180 that is not covered by the power line VDD, and an eleventh photolithography process is performed to form a contact hole 200a in the passivated insulative layer 200. The contact hole 200a correspond to positions of drain of the first drive transistor T12 and the second drive transistor T22. Specifically, the contact hole penetrates the passivated insulative layer 200 above the drains of the first drive transistor T12 and the second drive transistor T22.

Figure 23A:
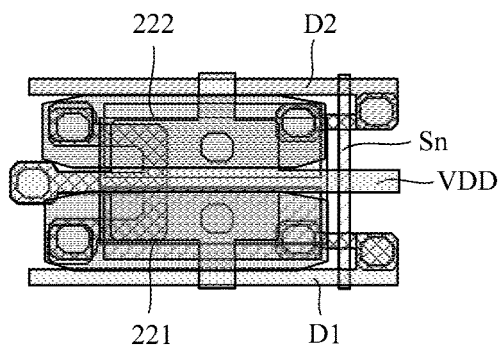
FIG. 23a is a planar schematic diagram of a pixel group of an OLED display panel after an anode is formed in Embodiment 2 of the present invention.
Figure 23B:
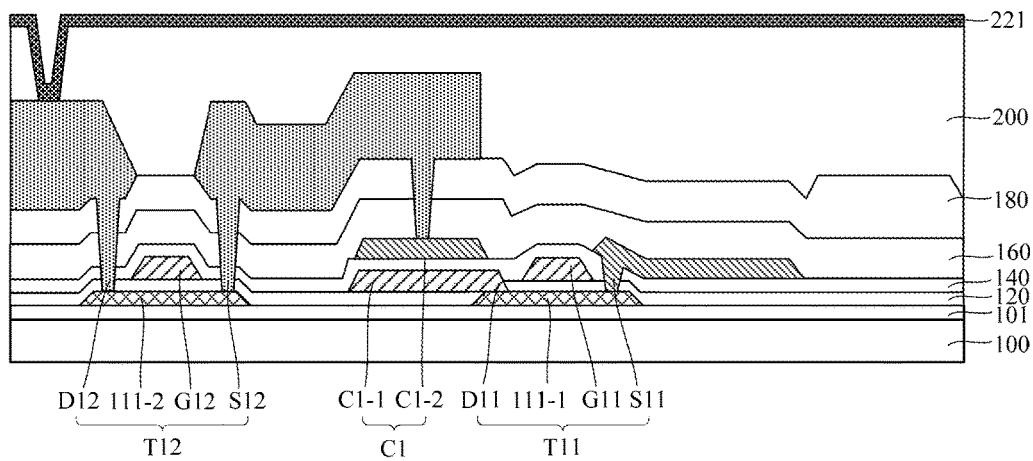
FIG. 23b is a cross-sectional schematic diagram of a first sub-pixel of an OLED display panel after the anode is formed in Embodiment 2 of the present invention.
Figure 23C:
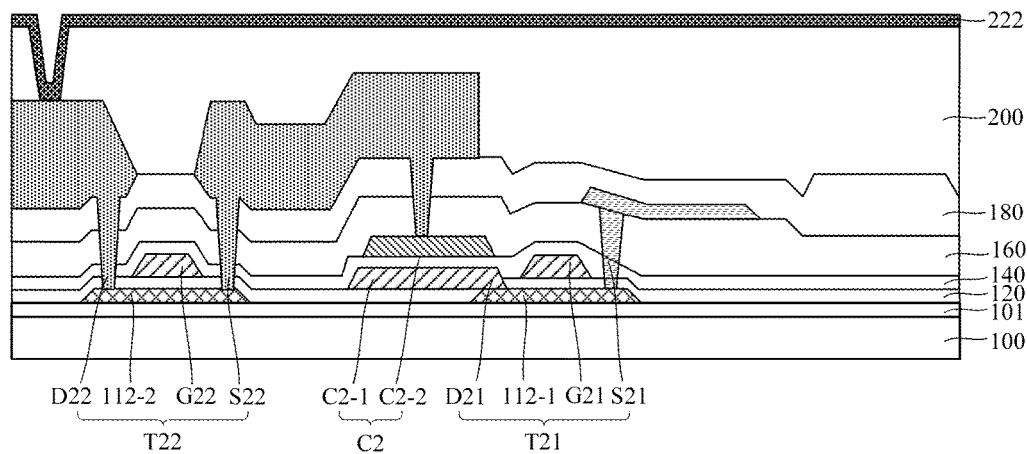
FIG. 23c is a cross-sectional schematic diagram of a second sub-pixel of an OLED display panel after the anode is formed in Embodiment 2 of the present invention.

FIG. 23*a* is a planar schematic diagram of a pixel group of an OLED display panel after an anode is formed in Embodiment 2 of the present invention. FIG. 23*b* is a cross-sectional schematic diagram of a first sub-pixel of an OLED display panel after the anode is formed in Embodiment 2 of the present invention. FIG. 23*c* is a cross-sectional schematic diagram of a second sub-pixel of an OLED display panel after the anode is formed in Embodiment 2 of the present invention.

As shown in FIGS. 23*a*, 23*b* and 23*c*, an electrode layer is formed on the passivated insulative layer 200 using a sputtering or evaporation process. A twelfth photolithography process is performed to pattern the electrode layer, so as to form an anode 221 of a first OLED and an anode 222 of a second OLED. The anode 221 of the first OLED is electrically connected to the drain D12 of the first drive transistor T12 through the contact hole 200*a*. The anode 222 of the second OLED is electrically connected to the drain D22 of the second drive transistor T22 through the contact hole 200*a*.

Further, after the anode 221 of the first OLED and the anode 222 of the second OLED are formed, a pixel restriction layer may be further formed using a conventional process. A light-emitting layer and a cathode may also be formed subsequently using the conventional process, to complete manufacture of the OLED device. Details are not described herein.

To sum up, in the OLED display panel of Embodiment 2, two sub-pixels form a group, and are arranged in mirror symmetry with respect to the power line VDD. The data lines respectively connected to the two sub-pixels in the same pixel group are located on different structural layers. Therefore, an in-layer distance between adjacent data lines is doubled without reducing the pixel area, and adjacent data lines on different layers are isolated by an interlayer insulative layer, thus effectively reducing the probability of occurrence of a short circuit between data lines. Moreover, crosstalk between the data lines is significantly eliminated during use, which not only enhances the product yield, but also improves the image quality of the product. Moreover, because the data lines correspondingly connected to the two sub-pixels in the same pixel group are disposed on different structural layers, the pixel area can be reduced based on existing apparatuses and process conditions, improving the PPI of the OLED display panel, and enhancing the resolution of the OLED display panel. In addition, the upper plate C1-2 of the first storage capacitor C1 and the upper plate C2-2 of the second storage capacitor C2 are formed through a process in one attempt, simplifying a manufacturing process and reducing the costs.

It should be noted that, the embodiments in the specification are described progressively, each embodiment emphasizes a part different from other embodiments, and identical or similar parts of the embodiments may be obtained with reference to each other. The structure disclosed in the embodiments is corresponding to the method disclosed in the embodiments, so it is described simply, and for related parts, reference may be made to the descriptions of the parts in the method embodiment.

The above merely describes preferred embodiments of the present invention, and is not intended to limit the present invention. Any replacements and modifications made by persons of ordinary skill in the art according to the disclosed content should all fall within the protection scope of claims of the present invention.

What is claimed is:

1. An OLED (Organic Light-Emitting Diode) display panel, comprising: a plurality of scan lines, data lines, and power lines formed on a substrate, the scan lines and the data lines defining a plurality of pixel groups arranged in a matrix, each pixel group having two sub-pixels, the two sub-pixels in a same pixel group connected to a same power line and arranged in mirror symmetry with respect to the power line, the two sub-pixels in a same pixel group connected to a pair of data lines of the plurality of data lines, the pair of data lines of the plurality of data lines being located on different structural layers, wherein the two sub-pixels in the same pixel group include a first sub-pixel and a second sub-pixel, the first sub-pixel comprising a first storage capacitor, the second sub-pixel comprising a second storage capacitor, wherein an upper plate of the first storage capacitor and an upper plate of the second storage capacitor are located on different structural layers; and the first subpixel further comprises a first switch transistor and a first drive transistor; the second sub-pixel further comprises a second switch transistor and a second drive transistor; a source of the first switch transistor is connected to a first data line of the pair of data lines; a source of the second switch transistor is connected to a second data line of the pair of data lines; the first data line, the second data line and the power line are parallel to one another; the scan line is perpendicular to the power line; and the first data line and the second data line, the first storage capacitor and the second storage capacitor, the first switch transistor and the second switch transistor, and the first drive transistor and the second drive transistor are respectively arranged in mirror symmetry with respect to the power line; a silicon island formed on the substrate and serving as an active layer for the first switch transistor, the first drive transistor, the second switch transistor and the second drive transistor.

2. The OLED display panel of claim 1, further comprising: a gate insulative layer and a plurality of first through holes, the gate insulative layer is formed on the substrate and the silicon island, a drain of the first switch transistor, a lower plate of the first storage capacitor, a drain of the second switch transistor and a lower plate of the second storage capacitor are electrically connected via the first through holes.

3. The OLED display panel of claim 2, further comprising:

a patterned first metal layer formed on the gate insulative layer for forming the scan line, the lower plate of the first storage capacitor, the lower plate of the second storage capacitor, a gate of the first switch transistor, a gate of the first drive transistor, a gate of the second switch transistor and a gate of the second drive transistor, and a first interlayer insulative layer and a second through hole, wherein the first interlayer insulative layer is formed on the gate insulative layer and the patterned first metal layer, and the first data line and the source of the first switch transistor are electrically connected via the second through hole.

4. The OLED display panel of claim 3, further comprising:

a patterned second metal layer faulted on the first interlayer insulative layer for forming the first data line, the source of the first switch transistor, and the upper plate of the second storage capacitor; and a second interlayer insulative layer and a third through hole, wherein the second interlayer insulative layer is formed on the first interlayer insulative layer and the patterned second metal layer, and wherein the second data line and the source of the second switch transistor are electrically connected via the third through hole.

5. The OLED display panel of claim 4, wherein the OLED display panel further comprises an opening, and wherein the opening penetrates the second interlayer insulative layer and faces the lower plate of the first storage capacitor.

6. The OLED display panel of claim 4, further comprising:
a patterned third metal layer Ruined on the second interlayer insulative layer for forming the second data line, the source of the second switch transistor and the upper plate of the first storage capacitor; and
a third interlayer insulative layer and fourth through holes, wherein the third interlayer insulative layer is formed on the second interlayer insulative layer and the patterned third metal layer, and wherein the source and the drain of the first drive transistor, the source and the drain of the second drive transistor, the power line, the upper plate of the first storage capacitor and the upper plate of the second storage capacitor are electrically connected via the fourth through holes.

7. The OLED display panel of claim 6, further comprising:
a patterned fourth metal layer formed on the third interlayer insulative layer for forming the source and the drain of the first drive transistor, the source and the drain of the second drive transistor and the power line; and
a passivated insulative layer and a plurality of contact holes, wherein the passivated insulative layer is formed on the third interlayer insulative layer and the patterned fourth metal layer; and wherein the drain of the first drive transistor, an anode of a first OLED, the drain of the second drive transistor and an anode of a second OLED are electrically connected via the contact holes.

8. A method for manufacturing an OLED (Organic Light-Emitting Diode) display panel, comprising:
forming a plurality of scan lines, data lines, and power lines on a substrate, the scan lines and the data lines defining a plurality of pixel groups arranged in a matrix,
wherein each pixel group has two sub-pixels, the two sub-pixels in a same pixel group connected to a same power line and arranged in mirror symmetry with respect to the power line, and wherein the two sub-pixels in a same pixel group are connected to a pair of data lines of the plurality of data lines, the pair of data lines of the plurality of data lines being located on different structural layers,
wherein the two sub-pixels in the same pixel group include a first sub-pixel and a second sub-pixel, the first sub-pixel comprising a first storage capacitor, the second sub-pixel comprising a second storage capacitor,
wherein an upper plate of the first storage capacitor and an upper plate of the second storage capacitor are located on different structural layers; and
the first sub-pixel further comprises a first switch transistor and a first drive transistor; the second sub-pixel further comprises a second switch transistor and a second drive transistor; a source of the first switch transistor is connected to a first data line of the pair of data lines; a source of the second switch transistor is connected to a second data line of the pair of data lines; the first data line, the second data line and the power line are parallel to one another; the scan line is perpendicular to the power line; and the first data line and the second data line, the first storage capacitor and the second storage capacitor, the first switch transistor and the second switch transistor, and the first drive transistor and the second drive transistor are respectively arranged in mirror symmetry with respect to the power line; forming a silicon island, wherein the silicon island serves as an active layer for the first switch transistor, the first drive transistor, the second switch transistor and the second drive transistor.

9. The method for manufacturing an OLED display panel of claim 8, further comprising: forming a gate insulative layer and a plurality of first through holes, wherein the gate insulative layer is formed on the substrate and the silicon island, and wherein a drain of the first switch transistor, a lower plate of the first storage capacitor, a drain of the second switch transistor and a lower plate of the second storage capacitor are electrically connected via the first through holes;
forming a patterned first metal layer on the gate insulative layer for foaming the scan line, the lower plate of the first storage capacitor, the lower plate of the second storage capacitor, a gate of the first switch transistor, a gate of the first drive transistor, a gate of the second switch transistor and a gate of the second drive transistor,
forming a first interlayer insulative layer and a second through hole, wherein the first interlayer insulative layer is formed on the gate insulative layer and the patterned first metal layer, and wherein the first data line and the source of the first switch transistor are electrically connected via the second through hole;
forming a patterned second metal layer on the first interlayer insulative layer for forming the first data line, the source of the first switch transistor, and the upper plate of the second storage capacitor;
forming a second interlayer insulative layer and a third through hole, wherein the second interlayer insulative layer is formed on the first interlayer insulative layer and the patterned second metal layer, and wherein the second data line and the source of the second switch transistor are electrically connected via the third through hole;
fixating a patterned third metal layer on the second interlayer insulative layer for forming the second data line, the source of the second switch transistor and the upper plate of the first storage capacitor;
forming a third interlayer insulative layer and fourth through holes, wherein the third interlayer insulative layer is formed on the second interlayer insulative layer and the patterned third metal layer, and wherein the source and the drain of the first drive transistor, the source and the drain of the second drive transistor, the power line, the upper plate of the first storage capacitor and the upper plate of the second storage capacitor are electrically connected via the fourth through holes;
forming a patterned fourth metal layer on the third interlayer insulative layer for forming the source and the drain of the first drive transistor, the source and the drain of the second drive transistor and the power line; and
forming a passivated insulative layer and a plurality of contact holes, wherein the passivated insulative layer is formed on the third interlayer insulative layer and the patterned fourth metal layer; and wherein the drain of the first drive transistor, an anode of a first OLED, the drain of the second drive transistor and an anode of a second OLED are electrically connected via the contact holes.

10. The method for manufacturing an OLED display panel of claim 9, wherein after the second interlayer insulative layer is formed, an opening penetrating the second interlayer insulative layer is further formed, the opening facing the lower plate of the first storage capacitor.

* * * * *